(12) United States Patent
Omagari et al.

(10) Patent No.: US 7,375,515 B2
(45) Date of Patent: May 20, 2008

(54) MAGNETIC SENSOR CIRCUIT AND SEMICONDUCTOR DEVICE CAPABLE OF TEMPERATURE COMPENSATION

(75) Inventors: Kazuya Omagari, Tokyo (JP); Masaki Mori, Aichi (JP)

(73) Assignee: Ricoh Company, Ltd., Tokyo (JP)

( * ) Notice: Subject to any disclaimer, the term of this patent is extended or adjusted under 35 U.S.C. 154(b) by 179 days.

(21) Appl. No.: 11/315,359

(22) Filed: Dec. 23, 2005

(65) Prior Publication Data

US 2006/0158182 A1 Jul. 20, 2006

(30) Foreign Application Priority Data

Dec. 27, 2004 (JP) ............................. 2004-377763
Dec. 27, 2004 (JP) ............................. 2004-377764

(51) Int. Cl.
*G01R 33/02* (2006.01)

(52) U.S. Cl. ....................... 324/249; 324/225; 324/260

(58) Field of Classification Search ........ 324/244–249, 324/260, 253, 225; 340/551–552
See application file for complete search history.

(56) References Cited

U.S. PATENT DOCUMENTS

| | | | | |
|---|---|---|---|---|
| 4,954,776 A * | 9/1990 | Husher | .................. | 324/207.16 |
| 5,182,953 A * | 2/1993 | Ellinger et al. | ......... | 73/862.335 |
| 6,529,007 B2 * | 3/2003 | Ott et al. | ..................... | 324/327 |
| 7,210,236 B2 * | 5/2007 | Sato et al. | ..................... | 33/356 |
| 2007/0114988 A1 * | 5/2007 | Rossmann et al. | ....... | 324/207.2 |

FOREIGN PATENT DOCUMENTS

| JP | 2000-019235 A | 1/2000 |
|---|---|---|
| JP | 2004-119517 A | 4/2004 |

OTHER PUBLICATIONS

Honkura et al, 'MI Sensor-based Electronic Compass for Mobile Phone Applications', The Magnetic Society of Japan, (2003), vol. 27, No. 11, pp. 1063-1068.

* cited by examiner

*Primary Examiner*—Jay M Patidar
(74) *Attorney, Agent, or Firm*—Dickstein Shapiro LLP

(57) ABSTRACT

A magnetic sensor circuit supplying an excitation current to an MI device, and having a detection signal supplied thereto corresponding to a magnetic field intensity from the MI device based on the excitation current. The magnetic sensor circuit includes a pulse current supplying circuit supplying a pulse current to the MI device; a sample-and-hold circuit maintaining an approximately peak value of the detection signal and outputting a hold signal; and a temperature compensation part compensating temperature characteristics of the magnetic sensor circuit with respect to the hold signal. The sample-and-hold circuit may include a switching circuit and a holding capacitor. The switching circuit may have an opening/closing control signal supplied thereto based on timing of the pulse current. The temperature compensation part may include a temperature detection circuit, a temperature compensation circuit, and an amplification circuit that has an amplification factor higher than that of the temperature compensation circuit.

28 Claims, 9 Drawing Sheets

FIG.7
(A)
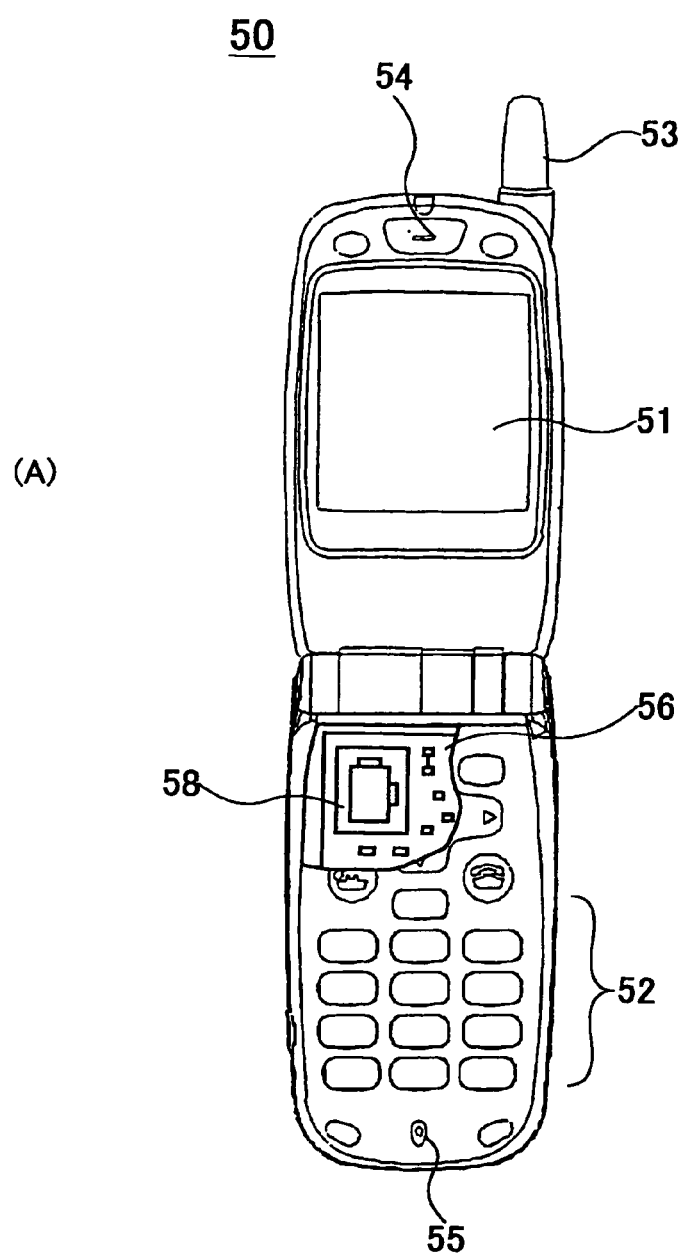
(B)
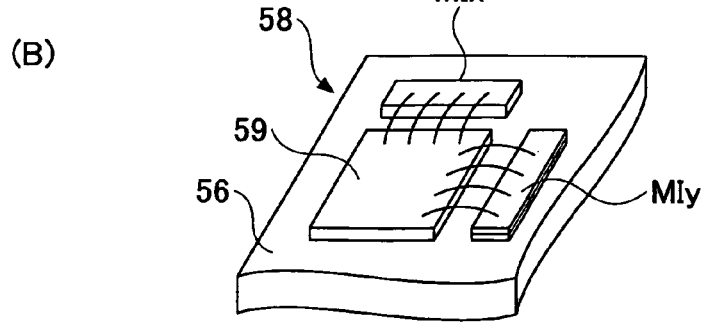

MAGNETIC SENSOR CIRCUIT AND SEMICONDUCTOR DEVICE CAPABLE OF TEMPERATURE COMPENSATION

BACKGROUND OF THE INVENTION

1. Field of the Invention

The present invention relates to a magnetic sensor circuit and a semiconductor device employed in an MI (magneto-impedance effect) sensor for detecting a weak magnetic field.

2. The Description of the Related Art

As a miniature and high-performance magnetic sensor, a magnetic impedance effect sensor (MI sensor) applying magnetic impedance (MI) effect has been proposed. The MI sensor employs a magnetism sensing device and an MI device, and detects magnetic field intensity applied to a soft-magnetic amorphous wire of the MI device. The MI effect corresponds to a phenomenon that, when a pulse current at a short time duration is made to flow through the soft-magnetic amorphous wire, impedance increases in proportion to magnetic field intensity applied to the soft-magnetic amorphous wire.

There is a MI sensor employing an impedance detection system in which the impedance of the soft-magnetic amorphous wire is detected and another MI sensor employing an inductance detection system in which only an inductance component of the soft-magnetic amorphous wire is detected.

In the impendence detection system, since the MI device only requires the amorphous wire, a structure of the MI device is advantageously simple. However, since output characteristics are symmetrical with respect to a zero magnetic field, a direction of a magnetic field should be measured separately, and a circuit configuration becomes complicated for measuring both positive and negative magnetic fields.

On the other hand, in the inductance detection system, a structure of the MI device is rather complicate since a detection coil is wound on the amorphous wire. However, since a linear output can be obtained with respect to positive through negative magnetic fields across a zero magnetic field, a circuit configuration is relatively simple. As a result, a study has been actively made for utilizing such a type of MI device in an electronic compass or such (for example, see Japanese Laid-open Patent Applications Nos. 2004-119517 and 2000-19235, as well as a journal of the magnetic society of Japan, Vol. 27, No. 11, (2003), pages 1063-1068, 'MI Sensor-based Electronic Compass for Mobile Phone Applications', written by Y. Honkura, H. Aoyama, M. Yamamoto, and E. Kako).

FIG. 1 shows a circuit diagram of a MI sensor in the related art. As shown in FIG. 1, each of MI devices 101 and 102 measure and output magnetic fields along two axes, i.e., x-axis and y-axis. In this MI sensor 100, a pulse signal generated by a pulse generating circuit 103 is supplied to the x-axis MI device 101 and the y-axis MI device 102 alternately via a timing signal generating circuit 104. Then, detection signals induced in detection coils of the respective MI devices 101 and 102 are held and detected in a sample-and-hold circuit 105, and is amplified and output from a differential amplification circuit 106.

Such an MI sensor is used outdoors in a form in which it is mounted in a portable terminal device such as a cellular phone, an automobile, or such. Therefore, such an environment of the MI sensor is expected as to have a temperature range between a freezing temperature and the order of 40° C.

Therefore, the MI sensor in which a temperature compensation circuit is mounted, so that a detection error in magnetic field intensity is reduced even under a temperature changing environment was proposed(see Japanese Laid-open Patent Application No. 2000-19235).

SUMMARY OF THE INVENTION

In the magnetic sensor disclosed by Japanese Laid-open Patent Application No. 2000-19235, as shown in FIG. 2, an operational amplifier 112 is employed for achieving feedback for compensating temperature characteristics of a Schottky barrier diode 111 used in a peak hold circuit 110. In this manner of temperature compensation, as disclosed in Japanese Laid-open Patent Application No. 2000-19235, a unity gain band width of the operational amplifier 112, used for the feedback, sharply falls in a range below 100 MHz. Thereby, a high-speed operational amplifier is required. Further, thereby, magnetic field intensity detection stability may not be sufficient under the environment in which an ambient temperature changes violently.

Further, since a circuit other than the MI device in the MI sensor is produced approximately in an IC chip for reducing its size, temperature characteristics of the MI sensor are affected by a circuit arrangement in the IC chip or a design of each particular device. If temperature compensation for such temperature characteristics should be achieved by means of changing device constants or changing circuit design, a considerable development time may be required, and a manufacturing cost may increase accordingly.

The present invention has been devised in consideration of the above-mentioned problems, and an object of the present invention is to provide a magnetic sensor circuit and a semiconductor device by which, even under a temperature changing environment, magnetic field intensity can be measured with a high accuracy.

According to a first aspect of the present invention, a magnetic sensor circuit supplying an excitation current to an MI device, and having a detection signal supplied thereto corresponding to a magnetic field intensity from the MI device based on the excitation current, is provided. The magnetic sensor circuit includes a pulse current supplying circuit supplying a pulse current to the MI device; a sample-and-hold circuit maintaining an approximately peak value of the detection signal and outputting a hold signal; and a temperature compensation part compensating temperature characteristics of the magnetic sensor circuit with respect to the hold signal.

In this configuration, the temperature compensation part is provided on an output side of the sample-and-hold circuit holding the approximately peak value of the detection signal corresponding to the magnetic field intensity. Since the hold signal has an approximately linear signal, temperature compensation is easier, and also, high-accuracy temperature compensation can be carried out. Further, the magnetic sensor circuit according to the present invention does not require an amplifier having superior high frequency characteristics in the temperature compensation part. As a result, the magnetic sensor circuit can detect magnetic field intensity with a high accuracy.

According to a second aspect of the present invention, in the magnetic sensor circuit according to the first aspect of the present invention, the temperature compensation part includes a temperature detection circuit detecting a temperature of the magnetic sensor circuit and outputting a temperature signal corresponding to the temperature; and a temperature compensation circuit correcting a voltage value of the hold signal based on the temperature signal.

In this configuration, by providing the temperature detection circuit to detect the temperature of the magnetic sensor circuit, a correction positively according to the temperature of the magnetic sensor direction can be carried out with respect to the voltage value of the hold signal.

According to a third aspect of the present invention, in the magnetic sensor circuit according to the first or the second aspect of the present invention, the MI device includes an amorphous wire and a detection coil; and the sample-and-hold circuit has the detection signal supplied thereto, the detection signal being one excited in the detection coil when the pulse signal flows through the amorphous wire.

In this configuration, since a linear output of the detection signal of the MI device can be obtained for magnetic fields from negative thorough positive across the zero magnetic field in the inductance detection system, a configuration of the magnetic sensor circuit can be made simpler than that of the impedance detection system.

According to a fourth aspect of the present invention, in the magnetic sensor circuit according to any one of the first through third aspects of the present invention, the sample-and-hold circuit includes a switching circuit and a holding capacitor; and the switching circuit has an opening/closing control signal supplied thereto based on timing of the pulse current.

In this configuration, temperature characteristics of the switching circuit of the sample-and-hold circuit can be compensated by the temperature compensation part.

According to a fifth aspect of the present invention, in the magnetic sensor circuit according to any one of the first through fourth aspects of the present invention, the temperature detection circuit detects the temperature with the use of temperature characteristics of diode's voltage-to-current characteristics.

A resistance value of a diode falls as the temperature rises according to the diode's voltage-to-current characteristics. With the use of the temperature characteristics of the voltage-to-current characteristics, the temperature of the magnetic sensor circuit can be detected in the fifth aspect of the present invention.

According to a sixth aspect of the present invention, in the magnetic sensor circuit according to any one of the first through fifth aspects of the present invention, the temperature compensation circuit corrects the hold signal with the temperature signal.

In this configuration, as a result of the temperature compensation circuit correcting the hold signal with the temperature signal which is in proportion to the temperature, change in the hold signal occurring due to temperature change can be corrected with a high accuracy.

According to a seventh aspect of the present invention, in the magnetic sensor circuit according to any one of the first through fourth aspects of the present invention, an amplification circuit is provided between the sample-and-hold circuit and the temperature compensation circuit; and the amplification circuit has an amplification factor higher than that of the temperature compensation circuit.

In this configuration, the weak hold signal is amplified into a relatively large voltage by means of the amplification circuit-in advance, and thus, degradation in an S/N ratio due to mixture of noise or such in the temperature compensation circuit can be inhibited. Further, fine adjustment can be carried out since a temperature compensation amount can be finely set as a result of an amplification factor in the temperature compensation circuit being set lower. As a result, change in the hold signal due to temperature change can be corrected with a high accuracy.

According to an eighth aspect of the present invention, in the magnetic sensor circuit according to the seventh aspect of the present invention, the temperature compensation circuit corrects the hold signal with the use of the temperature signal as a reference voltage value.

In this configuration, as the hold signal is corrected with the use of the temperature signal corresponding to the temperature, voltage change in the hold signal due to temperature change can be corrected with a high accuracy.

According to a ninth aspect of the present invention, in the magnetic sensor circuit according to the seventh or the eighth aspect of the present invention, the temperature signal has a voltage value corresponding to the temperature.

In this configuration, as the hold signal is corrected with the use of the temperature signal corresponding to the temperature, voltage change in the hold signal due to temperature change can be corrected with a high accuracy.

According to a tenth aspect of the present invention, in the magnetic sensor circuit according to any one of the seventh through ninth aspects of the present invention, the temperature detection circuit includes a first PN junction device and a second PN junction device having a current supplied thereto, which current is smaller in a current density than that of the first PN junction device, both having a same electric potential on their cathodes; and a subtracting circuit connected to respective anodes of the first and second PN junction devices, and outputting the temperature signal having a voltage value corresponding to an electric potential difference between the anodes.

In this configuration, the temperature of the magnetic sensor circuit is detected with the use of the electric potential difference of the anodes of the first and second PN junction devices, and thus, the temperature can be detected positively. Further, since a voltage value corresponding to the electric potential difference is applied as the temperature signal, temperature compensation in response to the temperature of the magnetic sensor circuit can be carried out with a high accuracy.

According to an eleventh aspect of the present invention, in the magnetic sensor circuit according to any one of the seventh through tenth aspects of the present invention, the temperature detection circuit includes a proportionality constant control circuit controlling a proportionality constant of a voltage value of the temperature signal corresponding to the temperature.

In this configuration, temperature compensation can be carried out as a result of the proportionality constant being controlled, even when the MI devices having the different voltages value of the detection signals with respect to the magnetic field intensity are connected. Further, when a change amount of the voltage value of the hold signal with respect to a predetermined temperature change changes, correction can be positively carried out as a result of the proportionality constant being thus controlled.

According to a twelfth aspect of the present invention, in the magnetic sensor circuit according to the eleventh aspect of the present invention, proportionality constant control is carried out in a state in which the magnetic field intensity applied to the MI device is approximately zero.

In this configuration, as a result of a setting of the proportionality constant being made in the state in which the external magnetic field intensity is approximately zero, the proportionality setting can be carried out easily.

According to a thirteenth aspect of the present invention, in the magnetic sensor circuit according to any one of the tenth through twelfth aspects of the present invention, the first and second PN junction devices correspond to first and second transistors having mutually different device areas; and respective collectors and bases of the first and second transistors are connected together, approximately equal currents are supplied to their emitters, and the respective emitters are connected to an input part of the subtracting circuit.

In this configuration, the first and second PN junction devices correspond to first and second transistors having mutually different device areas, approximately equal currents are supplied to their emitters, and a difference between the emitter voltages of the two transistors is obtained as the temperature signal. Accordingly, temperature detection with a high accuracy can be achieved.

According to a fourteenth aspect of the present invention, a semiconductor device supplies an excitation current to an MI device, and has a detection signal supplied thereto corresponding to magnetic field intensity from the MI device based on the excitation current, where the magnetic sensor circuit which includes the magnetic sensor circuit according to any one of the first through fourth aspects and the seventh through thirteenth aspects of the present invention is provided.

In this configuration, since temperature compensation with a high accuracy can be carried out in the magnetic sensor circuit according to any one of the first through fourth aspects and the seventh through thirteenth aspects of the present invention, the semiconductor device can be provided by which, even under an outdoor environment in which the ambient temperature changes violently, magnetic field intensity can be detected with a high accuracy. Further, since miniaturization of the semiconductor device can be achieved, a portable terminal device or such in which the magnetic sensor circuit is mounted can be miniaturized accordingly.

Thus, according to the first through fourteenth aspects of the present invention, the temperature compensation part is provided on the output side of the sample-and-hold circuit holding an approximately peak value of the detection signal corresponding to the magnetic field intensity. Since the hold signal is approximately a direct-current signal, temperature compensation can be made easily, and also, temperature compensation can be made with a high accuracy. As a result, the magnetic sensor circuit according to the present invention can detect the magnetic field intensity with a high accuracy even in an environment in which temperature change occurs.

According to a fifteenth aspect of the present invention, a magnetic sensor circuit supplying an excitation current to an MI device, and having a detection signal supplied thereto corresponding to magnetic field intensity from the MI device based on the excitation current, includes a pulse current supplying circuit supplying a pulse current to the MI device; a sample-and-hold circuit maintaining an approximately peak value of the detection signal and outputting a hold signal; and a temperature compensation part detecting a temperature of the magnetic sensor circuit and compensating temperature characteristics of the magnetic sensor circuit with respect-to the hold circuit based on a temperature signal corresponding to the temperature. There, the temperature compensation circuit includes a temperature signal polarity switching part switching a relation between a change direction of the temperature and a change direction of the temperature signal.

In this configuration, a temperature detection circuit and a temperature compensation circuit compensating a voltage change in the hold signal caused by temperature change are connected to the output side of the sample-and-hold circuit. In the temperature detection circuit, the temperature signal polarity switching circuit switching a change direction of the temperature signal with respect to temperature change is provided. As a result of the temperature signal polarity switching circuit being provided, an increasing/decreasing direction of a voltage value of the temperature signal can be set according to a change direction of the voltage value of the hold signal with respect to the temperature change direction. As a result, temperature compensation can be positively carried out according to temperature change in the magnetic sensor circuit.

Further, since the hold signal is an approximately direct-current signal in the magnetic sensor circuit according to the present invention, temperature compensation can be carried out easily, and also, temperature compensation can be carried out with a high accuracy.

According to a sixteenth aspect of the present invention, in the magnetic sensor circuit according to the fifteenth aspect of the present invention, the temperature compensation part includes the temperature detection circuit detecting a temperature of the magnetic sensor circuit and outputting a temperature signal corresponding to the temperature; and the temperature compensation circuit correcting a voltage value of the hold signal based on the temperature signal, wherein the temperature signal polarity switching circuit is provided in the temperature detection circuit.

In this configuration, as a result of the temperature detection circuit detecting the temperature of the magnetic sensor circuit being provided and the temperature signal polarity switching circuit being provided in the temperature detection circuit, correction of the voltage value of the hold signal can be carried out positively corresponding to the temperature of the magnetic sensor circuit.

According to a seventeenth aspect of the present invention, in the magnetic sensor circuit according to the fifteenth or sixteenth aspect of the present invention, the MI device includes an amorphous wire and a detection coil; and the sample-and-hold circuit has the detection signal supplied thereto, the detection signal being one excited in the detection coil when the pulse signal flows through the amorphous wire.

In this configuration, since a linear output of the detection signal of the MI device can be obtained for magnetic fields from negative thorough positive across the zero magnetic field in the inductance detection system, a configuration of the magnetic sensor circuit can be made simpler than that of the impedance detection system.

According to an eighteenth aspect of the present invention, in the magnetic sensor circuit according to any one of the fifteenth through seventeenth aspects of the present invention, the sample-and-hold circuit includes a switching circuit and a holding capacitor; and the switching circuit has an opening/closing control signal supplied thereto based on timing of the pulse current.

In this configuration, temperature characteristics of the switching circuit of the sample-and-hold circuit can be compensated by the temperature compensation part.

According to a nineteenth aspect of the present invention, in the magnetic sensor circuit according to any one of the fifteenth through eighteenth aspects of the present invention, an amplification circuit is provided between the sample-and-hold circuit and the temperature compensation circuit; and the amplification circuit has an amplification factor higher than that of the temperature compensation circuit.

In this configuration, the hold signal, even when it is weak, can be amplified into a relatively large voltage by means of the amplification circuit in advance, and thus, degradation in an S/N ratio due to mixture of noise or such in the temperature compensation circuit can be inhibited. Further, fine adjustment can be carried out since a temperature compensation amount can be finely set as a result of an amplification factor in the temperature compensation circuit being set lower. As a result, change in the hold signal due to temperature change can be corrected with a high accuracy.

According to a twentieth aspect of the present invention, in the magnetic sensor circuit according to any one of the fifteenth through nineteenth aspects of the present invention, the temperature compensation circuit corrects the hold signal with the use of the temperature signal as a reference voltage value.

In this configuration, as a result of the hold signal being corrected with the use of the temperature signal corresponding to the temperature, voltage change in the hold signal due to temperature change can be corrected.

According to a twenty-first aspect of the present invention, in the magnetic sensor circuit according to any one of the fifteenth through twentieth aspect of the present invention, the temperature signal has a voltage value corresponding to the temperature.

In this configuration, as the hold signal is corrected with the use of the temperature signal corresponding to the temperature, voltage change in the hold signal due to temperature change can be corrected with a high accuracy.

According to a twenty-second aspect of the present invention, in the magnetic sensor circuit according to any one of the fifteenth through twenty-first aspects of the present invention, the temperature detection circuit includes a first PN junction device and a second PN junction device having a current supplied thereto, which current is smaller in a current density than that of the fire PN junction device, both having a same electric potential on their cathodes; a subtracting circuit connected to respective anodes of the first and second PN junction devices, and outputting the temperature signal having a voltage value corresponding to an electric potential difference between the anodes; and the temperature signal polarity switching circuit includes a polarity switching circuit connecting respective ones of the anodes of the first and second PN junction devices with corresponding ones of two inputs of the subtracting circuit.

In this configuration, the temperature of the magnetic sensor circuit is detected with the use of the electric potential difference between the respective anodes of the first and second PN junction devices, and thus, the temperature can be detected positively. Further, since a voltage value corresponding to the electric potential difference is obtained as the temperature signal, temperature compensation in response to the temperature of the magnetic sensor circuit can be carried out with a high accuracy.

According to a twenty-third aspect of the present invention, in the magnetic sensor circuit according to any one of the twenty-second aspect, the polarity switching circuit has a switching signal controlling relationship between a change direction of the temperature and a change direction of the temperature signal.

In this configuration, the relationship between the change direction of the temperature and the change direction of the temperature signal can be easily controlled by the switching signal. Further, voltage change in the hold signal of the magnetic sensor circuit can be positively corrected without requiring design change or circuit device change of the magnetic sensors circuit.

In a twenty-fourth aspect of the present invention, in the magnetic sensor circuit according to the twenty-third aspect of the present invention, the temperature detection circuit includes a proportionality constant control circuit controlling a proportionality constant of a voltage value of the temperature signal corresponding to the temperature.

In this configuration, temperature compensation can be carried out as a result of the proportionality constant being controlled even when the MI devices having the different voltage values of the detection signals with respect to the magnetic field intensity are connected. Further, when a change amount of the voltage value of the hold signal with respect to a predetermined temperature change changes, correction can be positively carried out as a result of the proportionality constant being controlled.

According to a twenty-fifth aspect of the present invention, in the magnetic sensor circuit according to the twenty-fourth aspect of the present invention, proportionality constant control is carried out in a state in which the magnetic field intensity applied to the MI device is approximately zero.

In this configuration, as a result of setting of the proportionality constant being made in the state in which the external magnetic field intensity is approximately zero, the proportionality constant setting can be carried out easily.

According to a twenty-sixth aspect of the present invention, in the magnetic sensor circuit according to any one of the twenty-second through twenty-fifth aspects of the present invention, the first and second PN junction devices correspond to first and second transistors having mutually different device areas; and respective collectors and bases of the first and second transistors are connected together, approximately equal currents are supplied to their emitters, and the respective emitters are connected to the polarity switching circuit.

According to a twenty-seventh aspect of the present invention, a semiconductor device supplies an excitation current to an MI device and has a detection signal supplied thereto corresponding to a magnetic field intensity from the MI device based on the excitation current, where the magnetic sensor circuit including the magnetic sensor circuit according to any one of the fifteenth through twenty-sixth aspects of the present invention is provided.

In this configuration, since temperature compensation with a high accuracy can be carried out in the magnetic sensor circuit according to any one of the fifteenth through twenty-sixth aspects of the present invention, the semiconductor device in which, even under an outdoor environment in which the ambient temperature changes violently, a magnetic field intensity can be detected with a high accuracy. Further, since miniaturization of the semiconductor device can be achieved, a portable terminal device or such in which th magnetic sensor circuit is mounted can be miniaturized.

Thus, according to the fifteenth through the twenty-seventh aspects of the present invention, the temperature detection circuit and the temperature compensation circuit compensating voltage change in the hold signal caused by temperature change are connected to the output side of the sample-and-hold circuit, and the temperature signal polarity switching circuit switching a change direction of the temperature signal with respect to temperature change is provided in the temperature detection circuit. As a result of the temperature signal polarity switching circuit being provided, an increasing/decreasing direction of the voltage value of the temperature signal can be easily set according to change in the voltage value of the hold signal with respect to the temperature change direction. Thereby, temperature compensation can be positively carried out according to characteristics of the magnetic sensor circuit, and temperature compensation with a high accuracy can be achieved.

BRIEF DESCRIPTION OF THE DRAWINGS

Other objects and further features of the present invention will become more apparent from the following detailed description when read in conjunction with the accompanying drawings:

FIG. 7(A) shows a cellular phone as each of examples of electronic apparatuses in second and fourth carrying-out modes of the present invention, and (B) shows a magnified view of a magnetic sensor included therein;

DETAILED DESCRIPTION OF THE PREFERRED EMBODIMENTS

Best modes for carrying out the present invention (simply referred to as carrying-out modes, hereinafter) will now be described with reference to figures.

First, a first carrying-out mode of the present invention is described.

Figure 1:
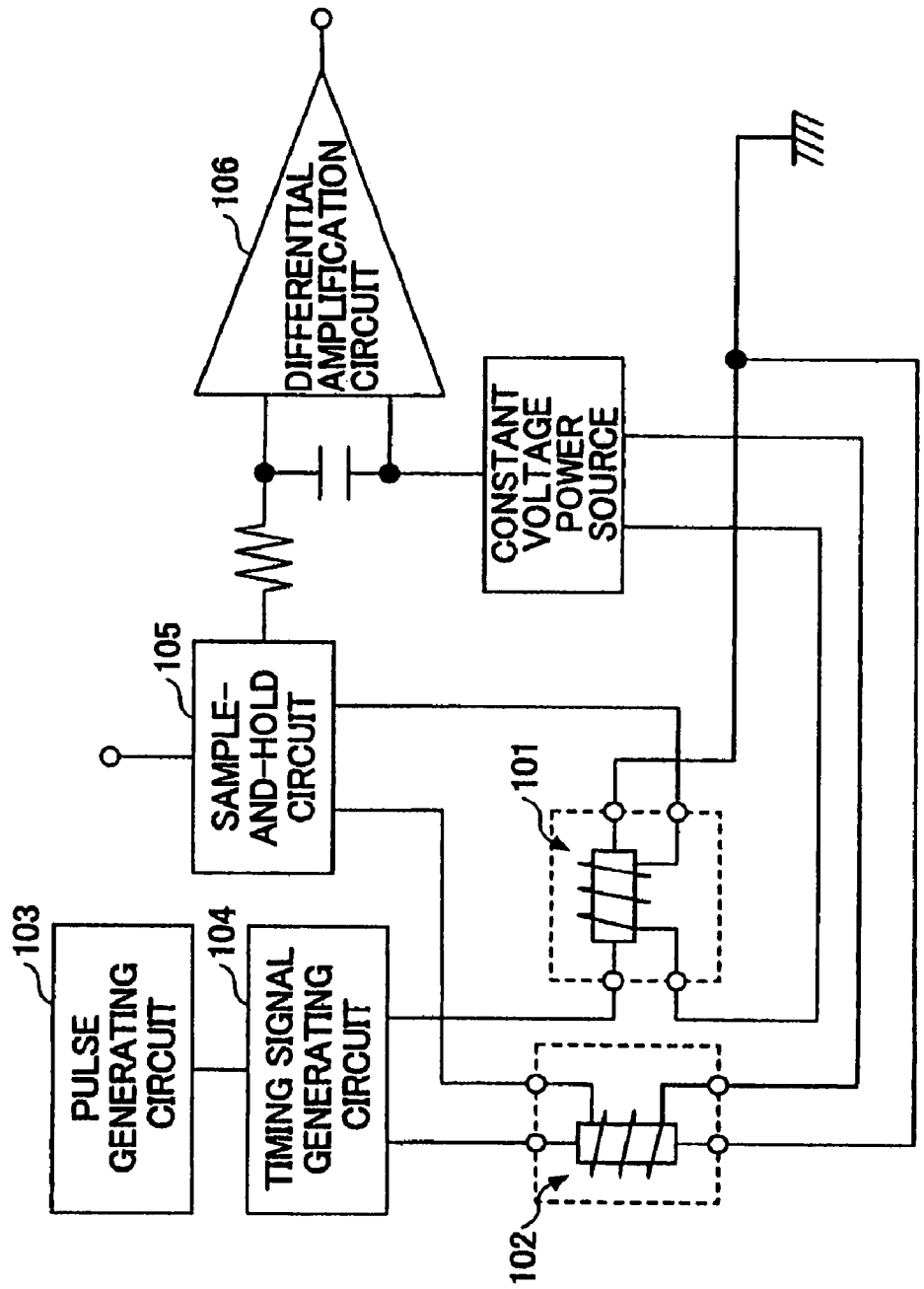
FIG. 1 shows a circuit diagram of an MI sensor in the related art.
Figure 2:
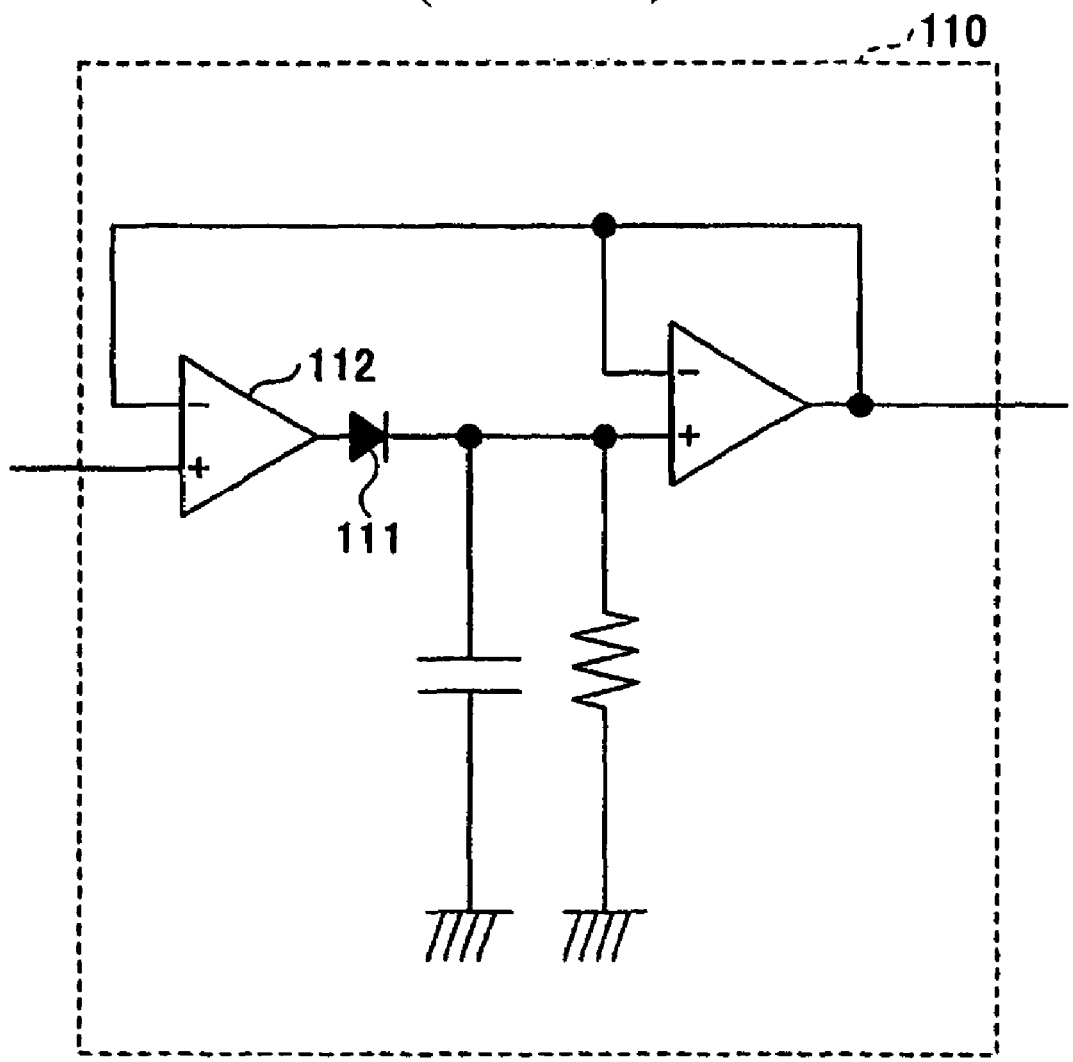
FIG. 2 shows a circuit diagram of another MI sensor in the related art.
Figure 3:
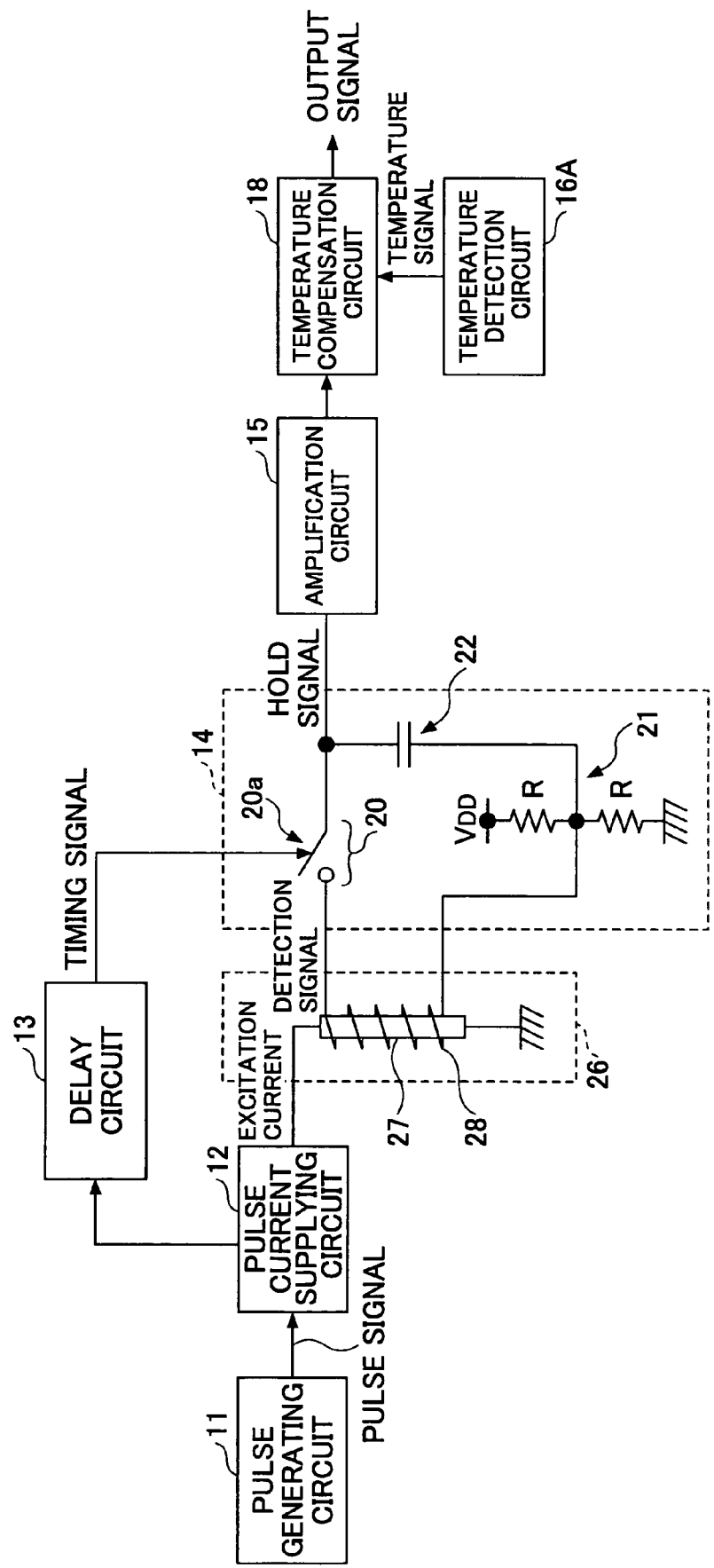
FIG. 3 shows a block diagram of a magnetic sensor circuit in a first carrying-out mode of the present invention.

FIG. 3 shows a block diagram of a magnetic sensor circuit according to the first carrying out mode of the present invention. It is preferable that the magnetic sensor circuit is mounted on a semiconductor device, for example, a single IC chip. FIG. 3 also shows an MI device connected to the semiconductor device.

With reference to FIG. 3, the magnetic sensor circuit 10A according to the present carrying-out mode includes a pulse generating circuit 11, a pulse current supplying circuit 12, a delay circuit 13, a sample-and-hold circuit 14, an amplification circuit 15, a temperature detection circuit 16A, and a temperature compensation circuit 18. The magnetic sensor circuit 10A has the MI device 26 connected thereto. The MI device 26 has its input terminal connected to an output terminal of the pulse current supplying circuit 12, and has its output terminal connected to the sample-and-hold circuit 14.

The pulse generating circuit 11 periodically outputs a pulse signal to the pulse current supplying circuit 12. The pulse generating circuit 11 is made of, for example, an oscillator employing a multi-vibrator or a quartz oscillator or such. The pulse signal has a pulse width of on the order of tens of nanoseconds, and its pulse interval is set appropriately according to a desired response speed.

The pulse current supplying circuit 12 amplifies an electric current of the pulse signal, and supplies an excitation current to an amorphous wire 27 of the MI device 26 connected to the semiconductor device. The excitation current is a pulse-shaped electric current having the same pulse width as that of the pulse signal. The pulse current supplying circuit 12 outputs a timing signal to the delay circuit 13 at the same time of the supply of the excitation circuit.

The MI device 26 includes the amorphous wire 27 and a detection coil 28 wound on the amorphous wire 2. The MI device detects a magnetic field intensity applied to the amorphous wire 27 according to the so-called inductance manner. The amorphous wire 27 is made of a soft-magnetic amorphous magnetic substance having a length of approximately several millimeters, and a diameter of tens of μm. For example, FeB, CoB, FeNiSiB, or such may be applied as the amorphous magnetic substance. Instead of the amorphous wire 27, a soft-magnetic thin film or a soft-magnetic thin member may be applied. The detection coil 28 is wound on the amorphous wire 27 by ten turns for example.

When the excitation current flows through the amorphous wire 27, a detection signal is induced in the detection coil 28 by MI effect. A wave height value of the detection signal is in proportion to intensity of a component of a magnetic field applied to the amorphous wire 27, which component is one along a longitudinal direction of the amorphous wire 27. As will be described later, the detection signal has a peak corresponding to each of rising up and decaying down of the excitation current. Either peak may be applied. However, applying a peak having a larger wave height is advantageous in a viewpoint of improving an S/N ratio. In the present carrying-out mode, the peak, corresponding to the excitation current rising up, of the detection current is applied.

The delay circuit 13 delays the timing signal by a predetermined delay time, and outputs the thus-delayed timing signal to a control input part 20a of a switch circuit 20. The delay time is set, for example, in a range between several nanoseconds and tens of nanoseconds.

The sample-and-hold circuit 14 includes the switch circuit 20, a reference voltage source 21, and a holding capacitor 22. The switch circuit 20 carries out turning on/off operation in response to the timing signal input to the control input part 20a, and outputs the detection signal to the capacitor 22.

One end of the capacitor 22 is connected to the reference voltage source 21 and to one end of the detection coil 28, and the other end thereof is connected to the switch circuit 20. The capacitor 22 has a function of holding the detection signal.

Figure 4:
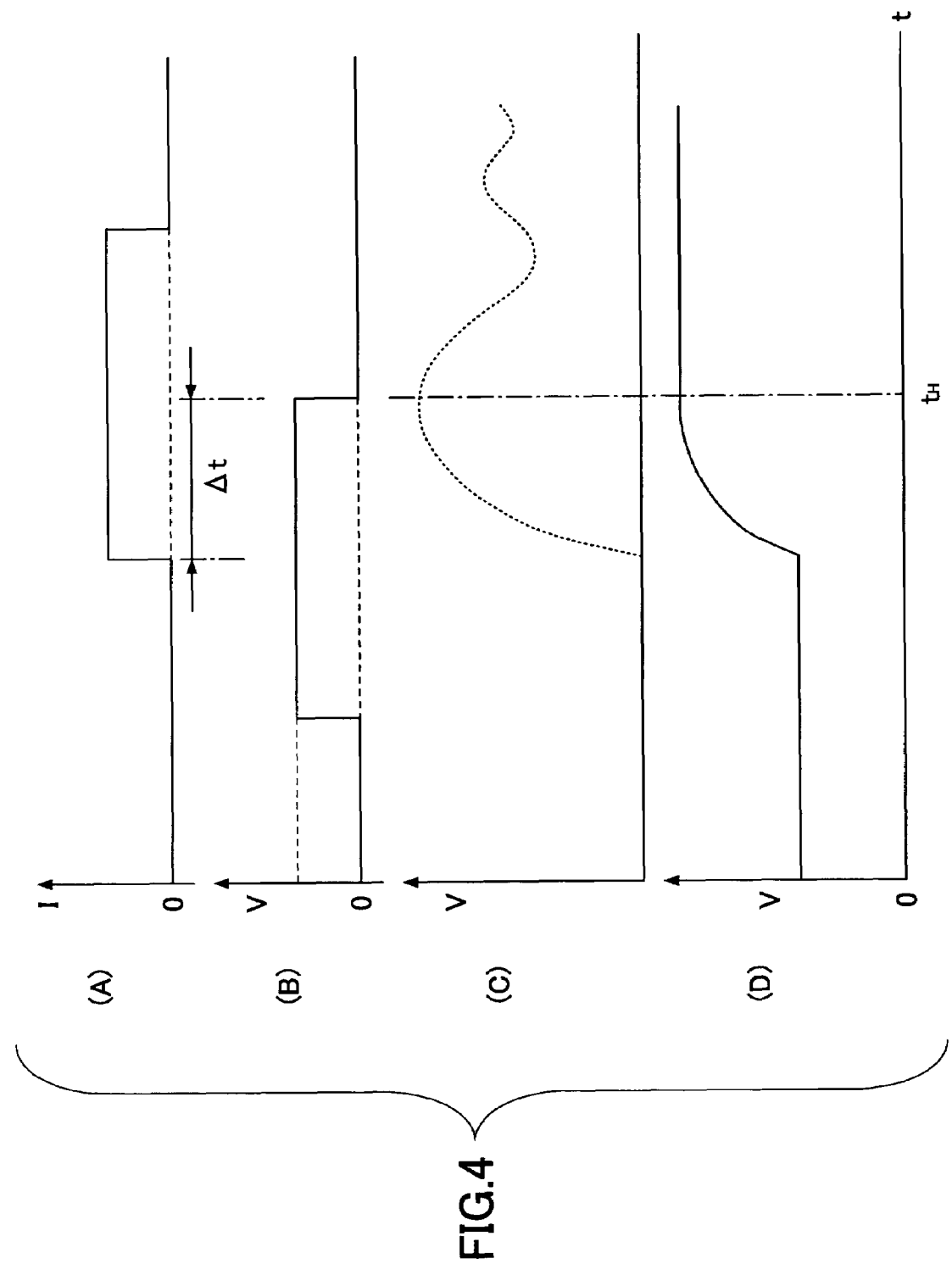
FIGS. 4(A) through (D) shows operation timing and waveforms.

FIGS. 4(A) through (D) shows operation timing and waveforms. FIG. 4(A) shows the excitation current; FIG. 4(B) shows the timing signal delayed by the delay circuit 13, FIG. 4(C) shows the detection signal induced in the detection coil 28; and FIG. 4(D) shows a hold signal.

With reference to FIGS. 4(A) through (D), the timing signal shown in FIG. 4(B) turns in its level from "High" to "Low" at a time delayed by a predetermined time Δt from rising up of the excitation current. Turning on/off of the switch circuit 20 is controlled by a state of the timing signal. That is, in the "High" state of the timing signal, the switch circuit 20 is turned on (conductive), and, the detection signal shown in FIG. 4(C) is supplied to the capacitor 22 from the detection coil 28 during the "High" state of the timing signal. Thereby, an electric potential of the capacitor 22 increases during this state.

Then, when the timing signal has its level of "Low", the switch circuit is turned off, and, as shown in FIG. 4(D), a voltage of the detection coil 28 at this time is held by the capacitor 22. The other electrode of the capacitor 22 is set as a reference voltage ($V_{DD}/2$), and as a result, the voltage of the capacitor 22 becomes (thus-held wave height value of detection signal)+ $V_{DD}/2$ The voltage of the capacitor 22 is referred to as the 'hold signal' hereinafter.

When a turning on resistance or turning on/off thresholds of the switch circuit 20 changes according to its temperature characteristics, a voltage change may occur in the hold signal, and thus, the output signal of the magnetic sensor circuit may change. In such a case, detection accuracy in the magnetic field intensity or the orientation degrades. Further, a magnitude or a rising-up time of the excitation current may change according to the temperature characteristics. Therefore, for a case where magnetic field intensity detection should be made with a high accuracy, possible errors occurring due to the temperature characteristics of the devices included in the magnetic sensor circuit should be totally compensated. The same problem concerning the temperature characteristics may occur also for a case where the magnetic sensor circuit 10A is produced in an IC, for example, a CMOS-type IC, an IC on which CMOS transistors and bipolar transistors are mounted in a mixed manner, or such.

In the magnetic sensor circuit 10A according to the present carrying-out mode, a temperature detection circuit 16A and a temperature compensation circuit 18 are provided at the output of the sample-and-hold circuit 14, and therewith, voltage fluctuation of the hold signal is compensated. Thereby, the above-mentioned problem is solved. The temperature detection circuit 16A and the temperature compensation circuit 18 are advantageous especially for a case where the switch circuit 20 in a form of an analog switch is mounted on the IC.

The hold signal is supplied to the amplification circuit 15, which amplifies it by a predetermined amplification factor. The amplification circuit 15 may be made of a voltage follower circuit having an amplification factor of 1 connected to the output of the capacitor 22. The amplification circuit 15 may be provided or may not be provided.

The temperature detection circuit 16A detects a temperature of the magnetic sensor 10A, and supplies a temperature signal having a voltage value corresponding to the temperature to the temperature compensation circuit 18. The temperature signal is set in such a manner that the voltage value thereof increases or decrease with respect to an increase of the temperature. The voltage value V(T) of the temperature signal is expressed as $$V(T)=\alpha \times (T-T_0)+\beta$$

where T denotes the temperature, and $\alpha$ denotes a proportionality constant which has either a positive or a negative value. $T_0$ denotes a reference temperature and $\beta$ denotes a reference voltage for the reference temperature $T_0$. When the proportionality constant has a positive value, the voltage value V(T) of the temperature signal increases as the temperature increases, while the voltage value V(T) of the temperature signal decreases as the temperature decreases. On the other hand, when the proportionality constant has a negative value, the voltage value V(T) of the temperature signal decreases as the temperature increases, while the voltage value V(T) of the temperature signal increases as the temperature decreases.

The temperature compensation circuit 18 corrects the hold signal amplified by the amplification circuit 15, with the use of the temperature signal, and outputs the thus-obtained signal as an output signal. The temperature compensation circuit 18, specifically, for example adds a voltage value in proportion to the voltage value of the temperature signal to the hold signal as a temperature compensation amount. Another amplification circuit may be further provided at the output of the temperature compensation circuit 18.

The temperature compensation amount is determined by a relation between the temperature and the voltage value of the temperature signal, that is, a setting of the above-mentioned proportionality constant $\alpha$ and the temperature of the magnetic sensor circuit 10A. The setting of the proportionality constant is made, for example, as follows: That is, the magnetic field intensity applied to the MI device 26 is set in zero, and the temperature of the magnetic sensor circuit 10A is changed. The proportionality constant $\alpha$ is selected such that, the voltage signal of the output signal obtained at this time may be approximately equivalent to the desired reference voltage value and may be constant.

The hold signal of the magnetic sensor circuit 10A may have a voltage fluctuation due to temperature characteristics thereof, i.e., the turning-on resistance of the switch circuit 20 of the magnetic sensor circuit 10A, turning-on/off thresholds of the switch circuit 20 or such for example. Even for such a case, in the magnetic sensor circuit 10A according to the present carrying-out mode, the voltage fluctuation in the hold signal due to the temperature characteristics is compensated by the temperature detection circuit 16A and the temperature compensation circuit 18 connected to the output of the sample-and-hold circuit 14. The hold signal is approximately a direct-current signal, and thus, temperature compensation is easier, and also, high-accuracy temperature compensation can be achieved. Further, in the magnetic sensor circuit 10A, an amplifier having especially superior radio frequency characteristics should not necessarily be applied in the amplification circuit 15 or the temperature compensation circuit 18. As a result, the magnetic sensor circuit 10A can detect the magnetic intensity with a high accuracy. Next, embodiments of the present carrying-out mode are described.

A first embodiment of the first carrying-out mode of the present invention is described now.

Figure 5:
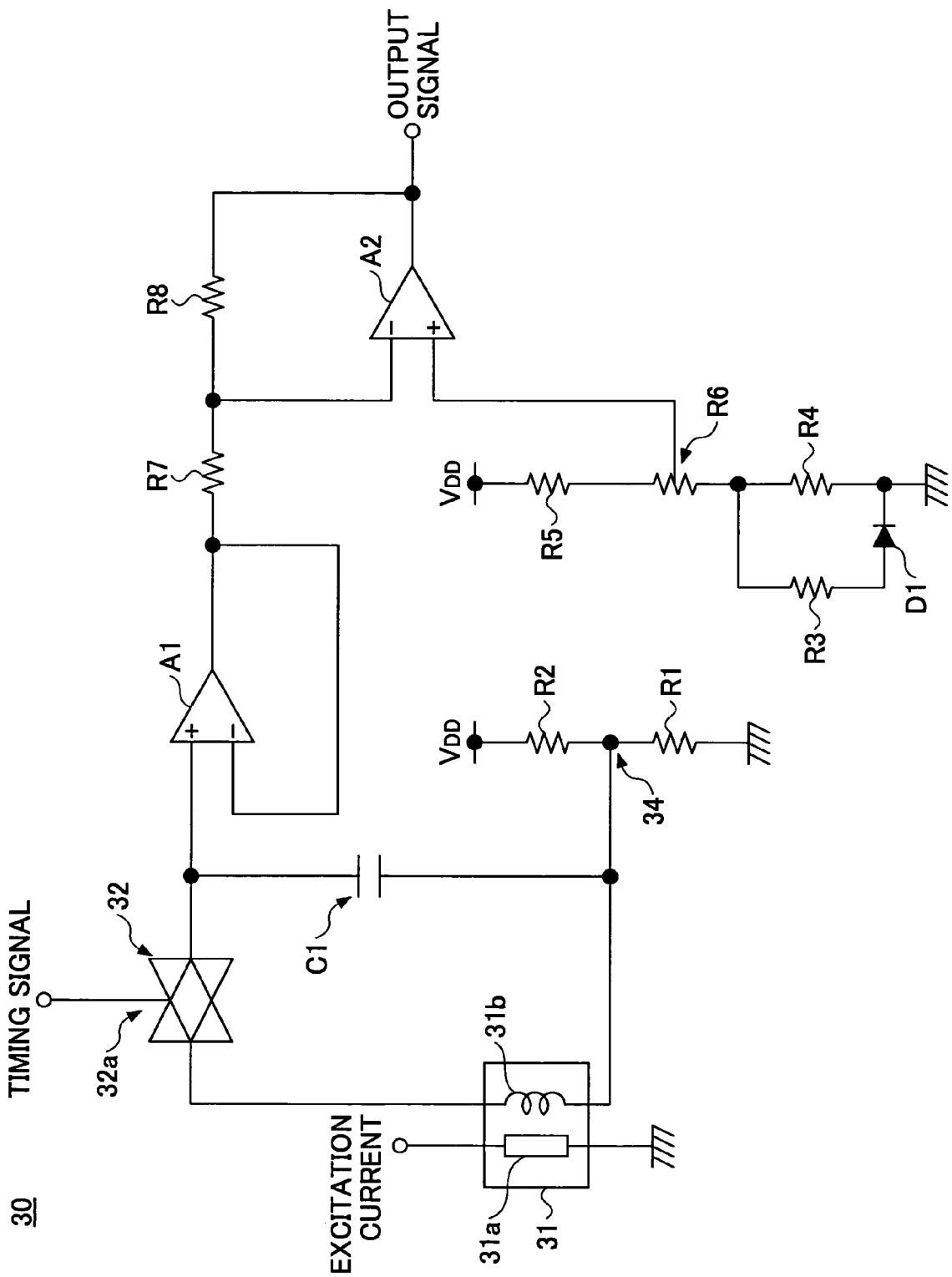
FIG. 5 shows a circuit diagram of a magnetic sensor circuit in a first embodiment of the first carrying-out mode of the present invention.

FIG. 5 shows a circuit diagram of a magnetic sensor circuit in the first embodiment of the first carrying-out mode of the present invention. FIG. 5 shows a circuit diagram of the magnetic sensor circuit downstream from a MI device, and also shows the MI device connected to the magnetic sensor circuit together.

With reference to FIG. 5, one end of a detection coil 31b of the MI device 31 is connected to an analog switch 32, and the other end thereof is connected to a reference voltage source 34. To a control input part 32a of the analog switch 32, the timing signal is supplied. As described above with reference to FIGS. 3 and 4, the timing signal is delayed by a predetermined time from the excitation current. Opening and closing of the analog switch 32 are controlled by the timing signal. An output of the analog switch 32 is connected to the capacitor C1. In the capacitor C1, a detection signal of the MI device 31 is held (as the hold signal).

The reference voltage source 34 includes resistors R1 and R1 connected in series, one end thereof is connected to a power source and the other end is grounded. Resistance values of the resistors R1 and R2 are set in equal to one another, a voltage of a half of the power source voltage $V_{DD}$ is taken from a connection point between the resistors R1 and R2, and this is connected to the detection coil 31b and the capacitor C1. A voltage (hold signal) of the capacitor C1 is input to a non-inverted input terminal of an operational amplifier A1.

The amplification circuit is made of the operational amplifier A1. The operational amplifier A1 has an amplification factor of 1 since its inverted input terminal is connected with its output terminal. As a result, a so-called voltage follower circuit is obtained. Since the voltage follower circuit has its input impedance in infinite, it can output a signal to a subsequent circuit without influencing the voltage value of the capacitor C4.

The temperature detection circuit is made of a diode D1, and resistors R3 through R6, one end of which is connected to the power source and the other end of which is grounded. The temperature detection circuit 16A detects a temperature of the magnetic sensor circuit 30 with the use of temperature characteristics of voltage-to-current characteristics of the diode D1. Specifically, when the temperature increases, a resistance value between the anode and the cathode of the diode D1 decreases, and thus, a combined resistance of the diode D1 and the resistors R3 and R4 decreases accordingly. As a result, a voltage (a voltage value of the temperature signal) at a voltage dividing point connected to the variable resistor R6 decreases. The voltage dividing point is connected to the non-inverted input terminal of an operational amplifier A2, and the input voltage thereof decreases accordingly The hold signal is supplied to the inverted-input terminal of the operational amplifier A2, and a difference between the hold signal and the temperature signal is amplified there and output therefrom. The amplification factor thereof is determined by a ratio between resistors R7 and R8, and, for example, is set in 10.

According to the present carrying-out mode, the temperature of the magnetic sensor circuit 30 is detected with the use of the temperature characteristics of the voltage-to-current characteristics of the diode D1, and the voltage of the hold signal is corrected with the voltage value of the temperature signal which is in proportion to the temperature, as the temperature compensation amount. Accordingly, a fluctuation in the hold voltage caused by the temperature can be inhibited, and thus, the magnetic sensor circuit which can measure magnetic field intensity with a high accuracy can be achieved.

In the temperature detection circuit, a diode and a resistor connected together in series may be connected to the resistor R5 in parallel, and thus, the total two diodes may be applied.

Next, a second embodiment of the present carrying-out mode is described.

Figure 6:
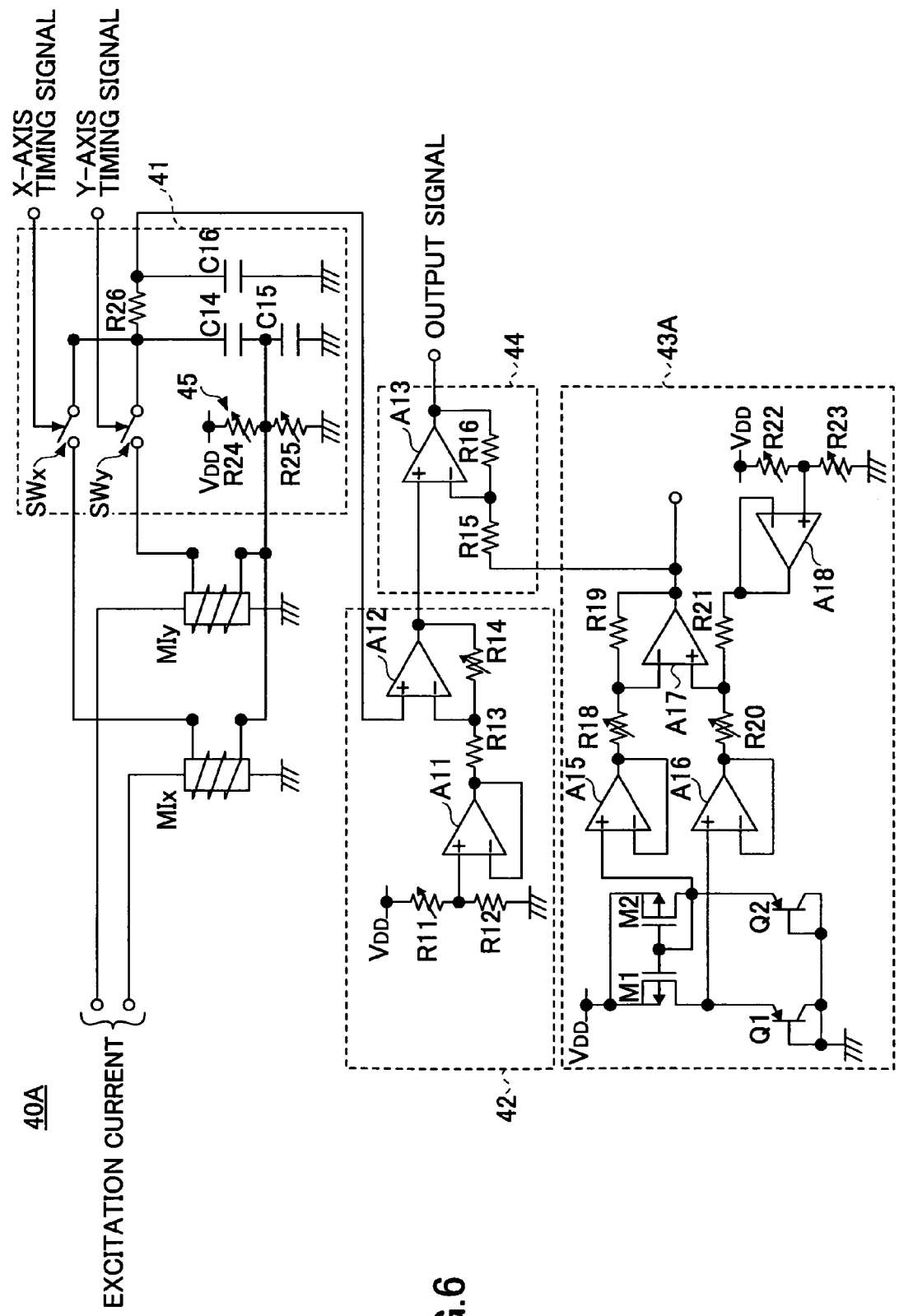
FIG. 6 shows a circuit diagram of a magnetic sensor circuit in a second embodiment of the first carrying-out mode of the present invention.

FIG. 6 shows a circuit diagram of a magnetic sensor circuit in the second embodiment of the first carrying-out mode of the present invention. The magnetic sensor circuit of FIG. 6 is one which should be preferably mounted on a semiconductor device, for example, an IC chip. FIG. 6 shows a circuit of the magnetic sensor circuit downstream from the sample-and-hold circuit, and also shows the MI device connected to the magnetic sensor circuit together. As will be described in detail, the magnetic sensor circuit of FIG. 6 has such a setting that the voltage of the hold signal increases as the temperature increases.

With reference to FIG. 6, the two MI devices MIx and MIy are made of, for example, respective amorphous wires disposed along an x-axis and a y-axis of a two-dimensional orthogonal coordinate system, for example. That is, the two MI devices are disposed perpendicularly to one another, and x-axis and y-axis components of the magnetic field are detected therewith.

One ends of respective detection coils of the x-axis and y-axis MI devices MIx and MIy are connected to two analog switches SWx and SWy, respectively, and the other ends thereof are connected to a reference voltage source. A timing signal is supplied in a time-series manner to the control input part of each of the analog switches SWx and SWy. Each timing signal is one delayed by a predetermined time from the excitation current as described above with reference to FIGS. 3 and 4. The analog switches SWx and SWy are opened or closed by the timing signals. The outputs of both analog switches SWx and SWy are connected together, and are connected to a capacitor C14. In the capacitor C14, detection signals of the x-axis and y-axis MI devices MIx and MIy are held in a time-series manner (as a hold signal).

The reference voltage source 45 is made of resistors R24 and R25 connected together in series, one end of which is connected to the power source and the other end thereof is grounded. A setting is made such that the resistance values of the resistors R24 and R25 are equal to one another, a voltage of a half of the power source voltage $V_{DD}$ is taken from a connection point between the resistors R24 and R25, and the connection point is connected to the common connection point of the respective detection coils. In order to make the resistance values of both resistors R24 and R25 precisely equal to one another, a trimming means is provided in either one or both of the resistors R24 and R25.

A voltage (the hold signal) of the capacitor C14 is output to the non-inverted input terminal of an operational amplifier A12 via a resistor R26.

An amplification circuit 42 includes operational amplifiers A11 and A12, and resistors R11 through R14. The inverted input terminal of the operational amplifier A12 is connected to the output of the operational amplifier A11 via the resistor R13. The non-inverted input terminal of the operational amplifier A11 is connected to a connection point between the resistors R11 and R12. One end of the resistors R11 and R12 connected together in series is connected to the power source and the other end thereof is grounded. Since the resistance values of the resistors R11 and R12 are set equivalent to one another, a voltage of a half of the power source voltage $V_{DD}$ is applied to the non-inverted input terminal of the operational amplifier A11. Since the inverted input terminal and the output terminal are short-circuited together, the voltage of the half of the power source voltage $V_{DD}$ is output from the output terminal of the operational amplifier A11. The output terminal of the operational amplifier A11 is connected to the inverted input terminal of the operational amplifier A12 via the resistor R13.

The resistors R14 is connected between the inverted input terminal of the operational amplifier A12 and the output terminal of the same. Accordingly, the operational amplifier A12 amplifies the hold voltage by an amplification factor determined by R14/R13, with the half voltage of the power source voltage $V_{DD}$ as a reference voltage. The output terminal of the operational amplifier A12 is connected to the non-inverted input terminal of an operation amplifier A13.

In order to make the resistance values of the resistors R11 and R12 precisely coincident, either one or both of the resistors R11 and R12 has a trimming means provided therein.

A temperature detection circuit 43A includes two PMOS transistors M1 and M2, configuring a current mirror circuit, two PNP transistors Q1 and Q2, connected to function as diodes, operational amplifier A15 through A18 and resistors R18 through R23.

The PNP transistors Q1 and Q2 are selected so that they have different device areas. For example, the device area of the PNP transistor Q2 is on the order of ten times that of the PNP transistor Q1. Electric current values flowing through emitters of the respective PNP transistors Q1 and Q2 are approximately equal to one another since these electric currents are drain electric currents of the PMOS transistors M1 and M2 configuring the current mirror circuit. Thereby, electric current densities on PN junctions of the respective PNP transistors Q1 and Q2 are different from one another, and the emitter voltage of the PNP transistor Q1 becomes higher than the emitter voltage of the PNP transistor Q2. An electric potential difference between the two PN junctions biased by the different electric current densities is in proportion to the absolute temperature. Accordingly, a difference between the two emitter voltages of the PNP transistors Q1 and Q2 corresponds to a voltage in proportion to the temperature. The two emitter electrodes of the PNP transistors Q1 and Q2 are connected to the respective non-inverted input terminals of the operational amplifiers A15 and A16.

Each of the operational amplifiers A15 and A16 forms a voltage follower circuit. The output terminal of the operational amplifier A15 is connected to the inverted input terminal of the operational amplifier A17 via a variable resistor R18. The output terminal of the operational amplifier A16 is connected to the non-inverted input terminal of the operational amplifier A17 via a variable resistor R20.

The operational amplifier A18 outputs the half voltage of the power source voltage $V_{DD}$ the same as the operational amplifier A11 described above. That is, the non-inverted input terminal of the operational amplifier A18 is connected to the connection point between the resistors R22 and R23 connected together in series. One end of the resistors R22 and R23 is connected to the power source and the other end is grounded. Either one or both of these resistors R22 and R23 has a trimming means provided therein. Therewith, trimming of the resistor R22 or R23 is carried out for a reference temperature, and thereby, offset adjustment is carried out such that the sample-and-hold voltage upon zero magnetic field may be ½ of the power source voltage $V_{DD}$. As a result, the output voltage of the operational amplifier A18 becomes a voltage V1 obtained from the offset voltage being added to the ½ voltage of the power source voltage $V_{DD}$. The output terminal of the operational amplifier A18 is connected to the inverted input terminal of the operational amplifier A17 via a resistor R21.

The operational amplifier A17 has an amplification factor determined by a ratio between the resistors R18 and R19, and a ratio between the resistors R20 and R21, and outputs an amplified signal to the inverted input terminal of the operational amplifier A13.

An adjustment means for the resistance value by trimming is provided in the resistors R18 and R20, and thus, the amplification factor of the operational amplifier A17 can be controlled. The adjustment means for the resistance value by trimming may also be provided in the resistors R19 and R21, or, the same may be provided in both. As a result of the amplification factor being thus controlled, the proportionality constant of the temperature signal with respect to the temperature can be controlled. Accordingly, although the MI devices having different voltage values of the detection signals with respect to the magnetic field intensity are connected, proper temperature compensation can be made possible as a result o the proportionality constant being controlled. Also, for a case where a change amount of the voltage value of the hold signal with respect to a predetermined temperature change fluctuates, the voltage value of the hold signal can be corrected as a result of the proportionality constant being controlled.

Further, the output of the operational amplifier A17, that is, the temperature signal, may be output externally from the magnetic sensor circuit 40A. Therewith, operation check of the temperature detection circuit 43A may be carried out, or, temperature information may be provided to an electronic apparatus in which the magnetic sensor is mounted.

A temperature compensation circuit 44 includes the operational amplifier A13 and resistors R15 and R16. The non-inverted input terminal of the operational amplifier A13 has the hold signal supplied thereto, and the operational amplifier A13 acts as a non-inverted amplifier for the hold signal. Further, the temperature signal is provided to the inverted input terminal of the operational amplifier A13, and the operational amplifier A13 acts as an inverted amplifier for the temperature signal. This inverted amplifier has an amplification factor expressed by −R16/R15, and this amplification factor becomes −1 when the resistors R15 and R16 have the same resistance value. In this case, an appllification factor of 2 is applied for the hold signal.

Thus, the operational amplifier A13 functions as a differential amplifier between the hold signal and the temperature signal, and outputs an output signal indicating a difference between the hold signal and the temperature signal. Thus, the operational amplifier 13 corrects a voltage fluctuation of the hold signal due to temperature characteristics of the magnetic sensor circuit. As a result, the temperature compensated output signal is output from the magnetic sensor circuit.

The operational amplifier A17 acts as a proportionality constant control circuit controlling an absolute value of the proportionality constant α determined by the ratio between the resistors R18 and R19 and the ratio between the resistors R20 and R21. The proportionality constant control circuit controls the amplification factor of the operational amplifier A17, and compensates a fluctuation amount of the voltage value of the hold signal upon zero magnetic field due to a temperature change. The resistors R18 through R21 are set as follows:

It is assumed that the amplification factor of the operational amplifier A13 for the voltage value of the temperature signal is set in −1. Next, in a condition in which the magnetic field applied to the MI devices is zero, the amplification factor of the operational amplifier A17 is set in such a manner that a voltage change amount of the hold signal and an absolute value of an output voltage change amount of the temperature compensation circuit 43A with respect to a predetermined temperature may be the same as one another. The amplification factor of the operational amplifier A17 is set with the use of the resistors R18 through R21. By carrying out the setting in this manner, a fluctuation amount of the voltage value of the hold signal upon zero magnetic field can be corrected. As a result, voltage fluctuation in the output signal due to a temperature change can be inhibited in a condition where an ordin1ry magnetic field intensity is detected, in the magnetic sensor circuit 40A.

Further, it is preferable to set the amplification factor of the operational amplifier A12 higher than the amplification factor of the operational amplifier A13. For example, the amplification factor of the operational amplifier A12 is set in 8 times while the amplification factor of the operational amplifier A13 is set in 2 times. By making such a setting, a weak hold signal can be amplified by the operational amplifier A12 in a relatively large voltage, and thereby, degradation in an S/N ratio otherwise occurring due to noise contamination or such can be inhibited. Further, by thus setting the amplification factor of the operational amplifier A13 lower, the temperature compensation amount can be finely set, and thus, fine adjustment can be easily carried out, and compensation with a high accuracy can be achieved.

Temperature compensation operation in the magnetic sensor circuit 40A is carried out as follows: A case is assumed that the voltage value of the hold signal upon zero magnetic field increases as the temperature of the magnetic sensor circuit 40A increases. In this case, when the temperature compensation operation were not carried out, the output voltage value of the operational amplifier A13 would increase accordingly.

However, actually, when the temperature thus increases, the emitter voltage of the PNP transistor Q2 of the temperature detection circuit 43A decreases to be lower than the emitter voltage of the PNP transistor Q1, and a difference therebetween increases. The emitter voltage of the PNP transistor Q2 is supplied to the inverted input terminal of the operational amplifier A17, while the emitter voltag4e of the PNP transistor Q1 is supplied to the non-inverted input terminal of the operational amplifier A17, via the operational amplifiers A15 and A16, respectively. As a result, the output voltage value of the operational amplifier A17 increases, and the output of the operational amplifier A13 falls. Thus, thanks to the temperature compensation operation, lowering of the voltage value of the hold signal due to the temperature rise can be corrected. It is noted that, when the temperature falls, compensation operation reverse to that described above for the temperature rise is carried out.

For a case where the voltage of the hold signal falls upon zero magnetic field due to a temperature rise in the magnetic sensor circuit 40A, the output destinations of the operational amplifier A15 and the operational amplifier A16 should be replaced, in the magnetic sensor circuit. That is, the output terminal of the operational amplifier A15 is connected to the non-inverted into terminal of the operational amplifier A17 via the resistor R20 and the output terminal of the operational amplifier A16 is connected to the inverted input terminal of the operational amplifier A17 via the resistor R18. By making such a connection, the voltage of the temperature signal input to the inverted input terminal of the operational amplifier A13 falls as the temperature rises. Then, the operational amplifier A13 amplifies a difference between the hold signal and the temperature signal, and thereby, the reduction in the voltage of the hold signal can be compensated.

According to the present embodiment, the amplification circuit 42, the temperature detection circuit 43A and the temperature compensation circuit 44, compensating a voltage fluctuation in the hold signal caused by temperature change, are connected to the output of the sample-and-hold circuit 41. The temperature detection circuit 43A detects the temperature, and outputs the temperature signal corresponding to the temperature. Then, the voltage fluctuation in the hold signal is corrected by the temperature signal. Since the hold signal is approximately a directed-current signal, temperature compensation can be easily carried out with the use of the temperature signal. Further, especially superior high frequency characteristics are not needed as the operational amplifier applied in the temperature compensation circuit 44, and thereby, temperature compensation with a high accuracy is made possible.

A second carrying-out mode of the present invention will now be described.

FIG. 7(A) shows a cellular phone as one example of an electronic apparatus according to the second carrying-out mode of the present invention, and FIG. 7(B) shows a magnified view of a magnetic sensor.

With reference to FIGS. 7(A) and (B), the cellular phone 50 includes a display part 51, an operation part 52, an antenna 53, a speaker 54, a microphone 56, an electronic substrate 56 and a magnetic sensor 58 mounted on the electronic substrate 56.

The MI sensor 58 includes a semiconductor device 59 in which a magnetic sensor circuit (not shown) according to the first carrying-out mode described above is produced, and two MI devices connected to the semiconductor device 59. The two MI devices MIx and MIy are disposed in such manner that they lie perpendicular to one another along the electronic substrate surface. Each of the MI devices MIx and MIy is connected to the magnetic sensor circuit of the semiconductor device 59 via wiring such as electric wires.

The MI sensor 58 detects an orientation or an angle of the cellular phone 50, for example, an orientation/angle in which a longitudinal direction of the operation part 52 lies, based on the direction of the earth magnetism. On the display part 51 of the cellular phone 50, a map of a current position and therearound is displayed such that the orientation/angle coincident with the longitudinal direction of the operation part 52 coincides with the top of the display part 51.

As described above, the MI sensor 58 has the magnetic sensor circuit according to the first carrying-out mode mounted on the semiconductor device, in the cellular phone 50. The magnetic sensor circuit can detect the magnetic field intensity with a high accuracy even when temperature change occurs. Accordingly, the detection of the orientation/angle has high reliability. Further, since the semiconductor device 59 is made of a single semiconductor chip, miniaturization of the magnetic sensor circuit is made possible. As a result, the cellular phone 50 can be miniaturized as a result of the semiconductor device 59 being applied.

A basic configuration itself for a communication function of the cellular phone 50 is well-known, and thus details thereof are omitted here. Although an electronic apparatus according to the present carrying-out mode has been thus described as the cellular phone as one example, a carrying-out mode of the electronic apparatus is not necessarily be limited to the cellular phone. For example, a portable terminal apparatus, a car navigation system or such may be applied instead.

A third carrying-out mode of the present invention will now be described.

Figure 8:
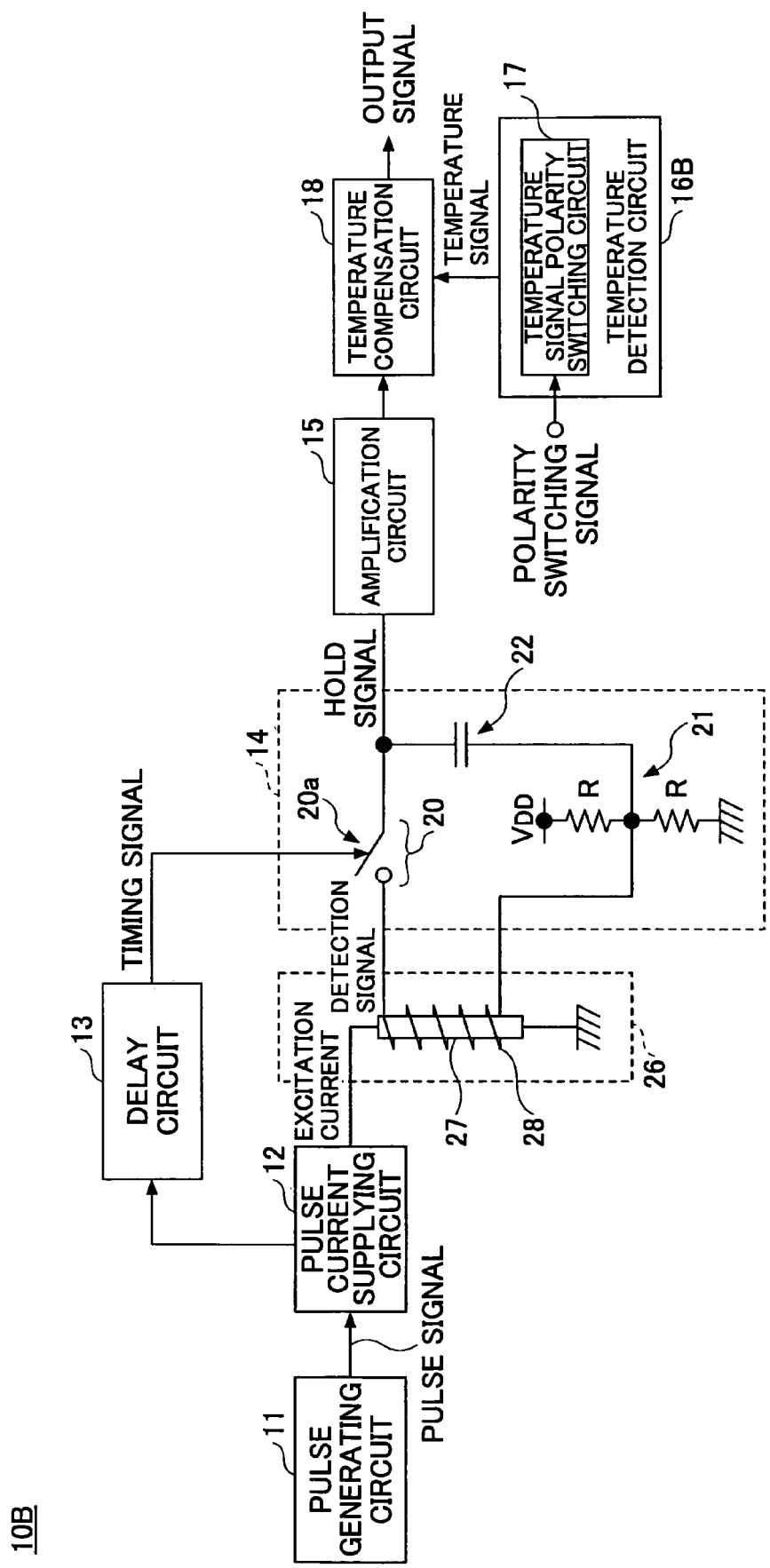
FIG. 8 shows a block diagram of a magnetic sensor circuit in a third carrying-out mode of the present invention.

FIG. 8 shows a block diagram of a magnetic sensor circuit according to the third carrying out mode of the present invention. The magnetic sensor circuit of FIG. 8 should be preferably mounted on a semiconductor device, for example, a single IC chip. FIG. 8 also shows an MI device connected to the semiconductor device.

With reference to FIG. 8, the magnetic sensor circuit 10B according to the present carrying-out mode includes a pulse generating circuit 11, a pulse current supplying circuit 12, a delay circuit 13, a sample-and-hold circuit 14, an amplification circuit 15, a temperature detection circuit 16B, and a temperature compensation circuit 18. The magnetic sensor circuit 10B has the MI device 26 connected thereto. The MI device 26 has its input terminal connected to an output terminal of the pulse current supplying circuit 12, and has its output terminal connected to the sample-and-hold circuit 14.

The pulse generating circuit 11 periodically outputs a pulse signal to the pulse current supplying circuit 12. The pulse generating circuit 11 is made of, for example, an oscillator employing a multi-vibrator or a quartz oscillator or such. The pulse signal has a pulse width of on the order of tens of nanoseconds, and its pulse interval is set appropriately according to a desired response speed.

The pulse current supplying circuit 12 amplifies an electric current of the pulse signal, and supplies an excitation current to an amorphous wire 27 of the MI device 26 connected to the semiconductor device. The excitation current is a pulse-shaped electric current having the same pulse width as that of the pulse signal. The pulse current supplying circuit 12 outputs a timing signal to the delay circuit 13 at the same time of the supply of the excitation circuit.

The MI device 26 includes the amorphous wire 27 and a detection coil 28 wound on the amorphous wire 27. The MI device detects a magnetic field intensity applied to the amorphous wire 27 in the so-called inductance manner. The amorphous wire 27 is made of a soft-magnetic amorphous magnetic substance having a length of approximately several millimeters, and a diameter of tens of μm. For example, FeB, CoB, FeNiSiB, or such, may be applied as the amorphous magnetic substance. Instead of the amorphous wire 27. a soft-magnetic thin film or a soft-magnetic thin member may be applied. The detection coil 28 is wound on the amorphous wire in 27, by a number of turns in a range between ten and a hundred, for example.

When the excitation current flows through the amorphous wire 27, a detection signal is induced in the detection coil 28 by MI effect. A wave height value of the detection signal is in proportion to an intensity of a component of a magnetic field applied to the amorphous wire 27, which component is one along a longitudinal direction of the amorphous wire 27. As will be described later, the detection signal has a peak corresponding to each of rising up and decaying down of the excitation current. Either peak may be applied. However, applying a peak having a larger wave height is advantageous in a viewpoint of improving an S/N ratio. In the present carrying-out mode, the peak, corresponding to the excitation current rising up, of the detection current is applied.

The delay circuit 13 delays the timing signal by a predetermined delay time, and outputs the thus-delayed timing signal to a control input part 20a of a switch circuit 20. The delay time is set, for example, in a range between several nanoseconds and tens of nanoseconds.

The sample-and-hold circuit 14 includes the switch circuit 20, a reference voltage source 21, and a holding capacitor 22. The switch circuit 20 carries out turning on/off operation in response to the timing signal input to the control input part 20a, and outputs the detection signal to the capacitor 22.

One end of the capacitor 22 is connected to the reference voltage source 21 and to one end of the detection coil 28, and the other end thereof is connected to the switch circuit 20. The capacitor 22 has a function of holding the detection signal.

FIGS. 4(A) through (D), which shows operation timing and waveforms for the first carrying-out mode described above, also shows operation timing and waveforms for the present third carrying-out mode. FIG. 4(A) shows the excitation current; FIG. 4(B) shows the timing signal delayed by the delay circuit 13, FIG. 4(C) shows the detection signal induced in the detection coil 28; and FIG. 4(D) shows a hold signal.

With reference to FIGS. 4(A) through (D), with respect to the excitation current shown in FIG. 4(A), the timing signal shown in FIG. 4(B) turns in its level from "High" to "Low" at a time delayed by a predetermined time Δt from rising up of the excitation current. Turning on/off of the switch circuit 20 is controlled by a state of the timing signal. That is, in the "High" state of the timing signal, the switch circuit 20 is turned on (conductive), and, the detection signal shown in FIG. 4(C) is supplied to the capacitor 22 from the detection coil 28 during the "High" state of the timing signal. Thereby, an electric potential of the capacitor 22 increases during this state accordingly.

Then, when the timing signal turns in its level in "Low", the switch circuit is turned off, and, as shown in FIG. 4(D), a voltage of the detection coil 28 at this time is held by the capacitor 22. The other electrode of the capacitor 22 is set in the reference voltage ($V_{DD}/2$), and as a result, the voltage of the capacitor 22 is equal to:

(thus-held wave height value of detection signal)+ $V_{DD}/2$

The voltage of the capacitor 22 is referred to as the 'hold signal' hereinafter.

When a turning on resistance or turning on/off thresholds of the switch circuit 20 changes according to its temperature characteristics, a voltage change may occur in the hold signal, and thus, the output signal of the magnetic sensor circuit may change. In such a case, the detection accuracy in the magnetic field intensity or the orientation degrades. Further, the magnitude or the rising-up time of the excitation current may change according to the temperature characteristics. Therefore, for a case where the magnetic field intensity detection should be made with a high accuracy, possible errors occurring due to the temperature characteristics of the devices included in the magnetic sensor circuit should be totally compensated. The same problem concerning the temperature characteristics may occur also for a case where the magnetic sensor circuit 10B is produced in an IC, for example, a CMOS-type IC, an IC on which CMOS transistors and bipolar transistors are mounted in a mixed manner, or such.

In the magnetic sensor circuit 10B according to the present carrying-out mode, a temperature detection circuit 16B and a temperature compensation circuit 18 are provided at the output of the sample-and-hold circuit 14, and therewith, a voltage fluctuation of the hold signal is compensated. Thereby, the above-mentioned problem is solved. The temperature detection circuit 16B and the temperature compensation circuit 18 are advantageous especially for a case where the switch circuit 20 in a form of an analog switch is mounted on the IC.

The hold signal is supplied to an amplification circuit 15, which amplifies it by a predetermined amplification factor. The amplification circuit 15 may be made of a voltage follower circuit having an amplification factor of 1 connected to the output of the capacitor 22. The amplification circuit 15 may be provided or may not be provided.

The temperature detection circuit 16B detects a temperature of the magnetic sensor 10B and supplies a temperature signal having a voltage value corresponding to the temperature, to the temperature compensation circuit 18. The temperature signal is set in such a manner that the voltage value thereof increases or decreases with respect to an increase in the temperature. The voltage value V(T) of the temperature signal is expressed as $$V(T)=\alpha \times (T-T_0)+\beta$$

where T denotes the temperature, and α denotes a proportionality constant which has either a positive or a negative value. $T_0$ denotes a reference temperature and β denotes a reference voltage for the reference temperature $T_0$. When the proportionality constant α has a positive value, the voltage value V(T) of the temperature signal increases as the temperature increases, while the voltage value V(T) of the temperature signal decreases as the temperature decreases.

On the other hand, when the proportionality constant α has a negative value, the voltage value V(T) of the temperature signal decreases as the temperature increases, while the voltage value V(T) of the temperature signal increases as the temperature decreases.

The temperature detection circuit 16B further has a temperature signal polarity switching circuit 17 for switching the sign of the proportionality constant α, i.e., switching between the positive value and the negative value of α. The temperature signal polarity switching circuit 17 switches the polarity of α between positive and negative, and thus, switches as to whether increasing or decreasing the voltage value V(T) of the temperature signal is to occur from a temperature rise. This switching is carried out as a result of a switching signal being supplied to the temperature signal polarity switching circuit 17. The switching signal may be generated from a switching signal setting circuit provided in the magnetic sensor circuit, or, may be supplied externally.

The temperature compensation circuit 18 corrects the hold signal amplified by the amplification circuit 15, with the use of the temperature signal, and outputs the thus-obtained signal as an output signal. The temperature compensation circuit 18, specifically, for example, adds a voltage value, in proportion to the voltage value of the temperature signal, to the hold signal as a temperature compensation amount. Another amplification circuit may be further provided at the output of the temperature compensation circuit 18.

The temperature compensation amount is determined by a relation between the temperature and the voltage value of the temperature signal, that is, a setting of the above-mentioned proportionality constant α and the temperature of the magnetic sensor circuit 10B. The setting of the proportionality constant α is made, for example, as follows: That is, first the magnetic field intensity applied to the MI device 26 is set in zero, and the temperature of the magnetic sensor circuit 10B is changed. Then, the proportionality constant α is selected such that, the voltage signal of the output signal obtained at this time may be approximately equivalent to the desired reference voltage value and also may be constant. The selection of the proportionality constant α is carried out in such a manner that the absolute value of α is set by the amplification factor of an operational amplifier in the temperature detection circuit, and the polarity of α is set by the temperature signal polarity switching circuit 17, for example.

The hold signal of the magnetic sensor circuit 10B may have a voltage fluctuation due to temperature characteristics thereof, i.e., the turning-on resistance of the switch circuit 20 of the magnetic sensor circuit 10B, turning-on/off thresholds of the switch circuit 20, or such, for example. Even for such a case, in the magnetic sensor circuit 10B according to the present carrying-out mode, the voltage fluctuation in the hold signal due to the temperature characteristics is compensated by the temperature detection circuit 16B and the temperature compensation circuit 18 connected to the output of the sample-and-hold circuit 14. In the temperature detection circuit 16 of the present carrying-out mode, the temperature signal polarity switching circuit 17 is provided which switches a changing direction of the temperature signal to output with respect to a temperature change. By thus providing the temperature signal polarity switching circuit 17, an increasing/decreasing direction of the voltage value of the temperature signal can be set according to a change direction of the voltage value of the hold signal occurring with respect to a temperature changing direction.

As a result, temperature compensation can be positively carried out suitably to characteristics of the magnetic sensor circuit.

The hold signal is approximately a direct-current signal in the magnetic sensor circuit 10B according to the present carrying-out mode, and thus, temperature compensation is easier, and also, high-accuracy temperature compensation can be achieved. Next, an embodiment of the present third carrying-out mode will be described.

Figure 9:
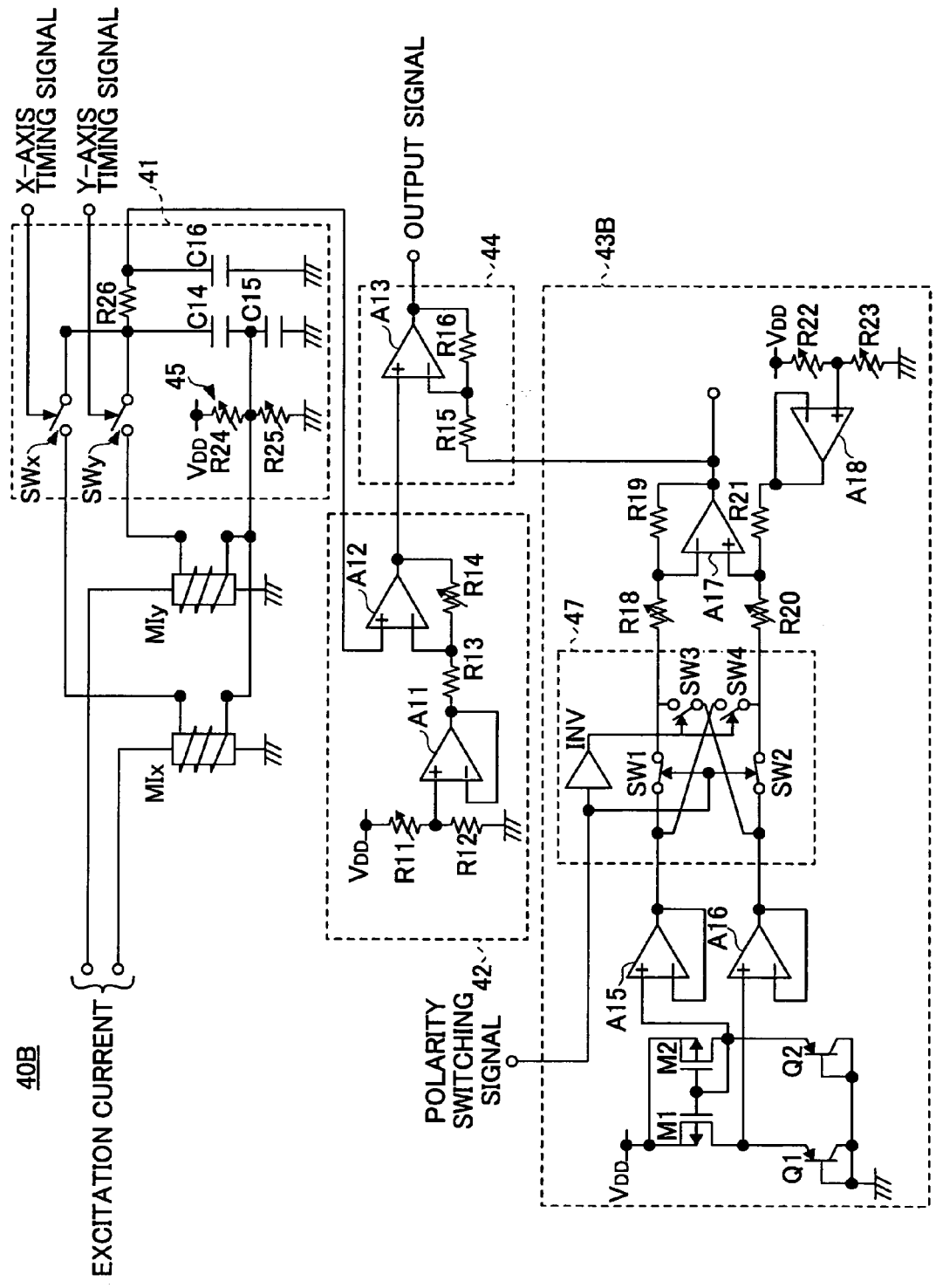
FIG. 9 shows a circuit diagram of a magnetic sensor circuit in an embodiment of the third carrying-out mode of the present invention.

FIG. 9 shows a circuit diagram of a magnetic sensor circuit in one embodiment of the third carrying-out mode of the present invention. The magnetic sensor circuit of FIG. 9 should be preferably mounted on a semiconductor device, for example, a single IC chip. FIG. 9 shows a circuit diagram of the magnetic sensor circuit, downstream from the sample-and-hold circuit, and also, shows the MI device connected to the magnetic sensor circuit together. The magnetic sensor circuit of FIG. 9 has a setting such that the voltage of the hold signal increases along with a temperature rise.

With reference to FIG. 9, two MI devices MIx and MIy are made of respective amorphous wires disposed along an x-axis and a y-axis of a two-dimensional orthogonal coordinate system, for example. That is, the two MI devices are disposed perpendicularly to one another, and x-axis and y-axis components of the magnetic field are detected therewith.

One ends of the respective detection coils of the x-axis and y-axis MI devices MIx and MIy are connected to two analog switches SWx and SWy, respectively, and the other ends thereof are connected to a reference voltage source. A timing signal is supplied in a time-series manner to a control input part of each of the analog switches SWx and SWy. The timing signal is one delayed by a predetermined time from an excitation current as described above with reference to FIGS. 8 and 4. The analog switches SWx and SWy are opened or closed according to the timing signal. The output terminals of both analog switches SWx and SWy are connected together, and are connected to a capacitor C14. In the capacitor C14, detection signals of the x-axis and y-axis MI devices MIx and MIy are held in a time-series manner (as a hold signal).

The reference voltage source 45 is made of resistors R24 and R25 connected together in series, one end of which is connected to a power source and the other end thereof is grounded. A setting is made such that the resistance values of the resistors R24 and R25 are equal to one another, a voltage of a half of the power source voltage $V_{DD}$ is taken from a connection point between the resistors R24 and R25, and the connection point is connected to the common connection point of the respective detection coils. In order to make the resistance values of both resistors R24 and R25 precisely equal to one another, a trimming means is provided in either one or both of the resistors R24 and R25.

A voltage (the hold signal) of the capacitor C14 is output to a non-inverted input terminal of an operational amplifier A12 via a resistor R26.

An amplification circuit 42 includes operational amplifiers A11 and A12, and resistors R11 through R14. The inverted input terminal of the operational amplifier A12 is connected to the output of the operational amplifier A11 via the resistor R13. The non-inverted input terminal of the operational amplifier A11 is connected to a connection point between the resistors R11 and R12. One end of the resistors R11 and R12, connected together in series, is connected to the power source and the other end thereof is grounded. Since the resistance values of the resistors R11 and R12 are set equivalent to one another, a voltage of a half of the power source voltage $V_{DD}$ is applied to the non-inverted input terminal of the operational amplifier A11. Since the inverted input terminal and the output terminal are short-circuited together, the voltage of the half of the power source voltage $V_{DD}$ is output from the output terminal of the operational amplifier A11. The output terminal of the operational amplifier A11 is connected to the inverted input terminal of the operational amplifier A12 via the resistor R13.

The resistor R14 is connected between the inverted input terminal of the operational amplifier A12 and the output terminal of the same. Accordingly, the operational amplifier A12 amplifies the hold voltage by an amplification factor determined by R14/R13, with the half voltage of the power source voltage $V_{DD}$ as a reference voltage. The output terminal of the operational amplifier A12 is connected to the non-inverted input terminal of an operation amplifier A13.

In order to make the resistance values of the resistors R11 and R12 precisely coincident, either one or both of the resistors R11 and R12 has a trimming means provided therein.

A temperature detection circuit 43B includes two PMOS transistors M1 and M2, configuring a current mirror circuit, two PNP transistors Q1 and Q2, connected to function as diodes, operational amplifier A15 through A18, resistors R18 through R23, and a temperature signal polarity switching circuit 47.

The PNP transistors Q1 and Q2 are selected so that they have different device areas. For example, the device area of the PNP transistor Q2 is on the order of ten times that of the PNP transistor Q1. Electric current values flowing through emitters of the respective PNP transistors Q1 and Q2 are approximately equal to one another since these electric currents are drain electric currents of the PMOS transistors M1 and M2 configuring the current mirror circuit. Thereby, electric current densities on PN junctions of the respective PNP transistors Q1 and Q2 are different from one another, and the emitter voltage of the PNP transistor Q1 becomes higher than the emitter voltage of the PNP transistor Q2. An electric potential difference between the two PN junctions biased by the different electric current densities is in proportion to the absolute temperature. Accordingly, a difference between the two emitter voltages of the PNP transistors Q1 and Q2 becomes a voltage in proportion to the temperature. The two emitter electrodes of the PNP transistors Q1 and Q2 are connected to the respective non-inverted input terminals of the operational amplifiers A15 and A16.

Each of the operational amplifiers A15 and A16 forms a voltage follower circuit. The output terminals of the operational amplifiers A15 and A16 are connected to the temperature signal polarity switching circuit 47.

The temperature signal polarity switching circuit 47 includes four switch circuits SW1 through SW4, and an inverter INV. The switch circuits SW1 and SW2 operate cooperatively so as to have a same opening/closing state. Also, the switch circuits SW3 and SW4 operate cooperatively so as to have a same opening/closing state. Further, a polarity switching signal is supplied to the switch circuits as a control signal, and opening/closing operations of the switch circuits are carried out according to a state of the polarity switching signal. Specifically, the polarity switching signal is supplied directly to the switch circuits SW1 and SW2, while the polarity switching signal is once inverted by the inverter INV and, after that, is provided to the switch circuits SW3 and SW4, as shown. Accordingly, for example, when the polarity switching signal has a "High" level, each of the switch circuits SW1 and SW2 is closed, while each of the switch circuits SW3 and SW4 is opened. On the other hand, when the polarity switching signal has a "Low" level, each of the switch circuits SW1 and SW2 is opened, while each of the switch circuits SW3 and SW4 is closed.

Outputs of the temperature signal polarity switching circuit 47 are connected to input terminals of an operational amplifier A17 via variable resistors R18 and R20. When the polarity switching signal has a "High" level, the switch circuits SW1 and SW2 are closed. In this state, the output terminal of the operational amplifier A15 is connected to the inverted input terminal of the operational amplifier A17, while the output terminal of the operational amplifier A16 is connected to the non-inverted input terminal of the operational amplifier A17. In this connection state, with respect to a temperature rise, a voltage drop amount is larger in the emitter voltage of the transistor Q2 than that of the emitter voltage of the transistor Q1. Accordingly, a difference between a voltage V+ input to the non-inverted input terminal of the operational amplifier A17 and a voltage V− input to the inverted input terminal of the operational amplifier A17, i.e., ((V+)-(V−)), increases, accordingly. That is, this connection state corresponds to the above-mentioned state in which the sign of the proportionality constant α is set in positive.

On the other hand, when the polarity switching signal has a "Low" level, the switch circuits SW3 and SW4 are closed. In this state, the output terminal of the operational amplifier A15 is connected to the non-inverted input terminal of the operational amplifier A17, while the output terminal of the operational amplifier A16 is connected to the inverted input terminal of the operational amplifier A17. In this connection state, with respect to a temperature rise, a voltage drop amount is larger in the emitter voltage of the transistor Q2 than that of the emitter voltage of the transistor Q1. Accordingly, a difference between a voltage V− input to the inverted input terminal of the operational amplifier A17 and a voltage V+ input to the non-inverted input terminal of the operational amplifier A17, i.e., ((V−)-(V+)), increases, accordingly. That is, this connection state corresponds to the above-mentioned state in which the sign of the proportionality constant α is set in negative.

The operational amplifier A18 outputs the half voltage of the power source voltage $V_{DD}$ the same as the operational amplifier A11 as described above. That is, the non-inverted input terminal of the operational amplifier A18 is connected to the connection point between the resistors R22 and R23 connected together in series. One end of the resistors R22 and R23 is connected to the power source and the other end is grounded. Either one or both of these resistors R22 and R23 has a trimming means provided therein. Therewith, trimming of the resistor R22 or R23 is carried out for a reference temperature, and thereby, offset adjustment is carried out such that the sample-and-hold voltage upon zero magnetic field may be ½ of the power source voltage $V_{DD}$ for the reference temperature. As a result, the output voltage of the operational amplifier A18 becomes a voltage V1, obtained from the offset voltage being added to the ½ voltage of the power source voltage $V_{DD}$. The output terminal of the operational amplifier A18 is connected to the inverted input terminal of the operational amplifier A17 via a resistor R21.

To the input terminals of the operational amplifier A17, the output terminals of the operational amplifiers A15 and A16 are connected, respectively, according to a connection state in the temperature signal polarity switching circuit 47 described above. The operational amplifier A17 has an amplification factor determined by a ratio between the resistors R18 and R19, and a ratio between the resistors R20 and R21, and outputs an amplified signal to the inverted input terminal of the operational amplifier A13.

An adjustment means for the resistance value by trimming is provided in the resistors R18 and R20, and thus, the amplification factor of the operational amplifier A17 can be controlled. The adjustment means for the resistance value by trimming may also be provided in the resistors R19 and R21, or, the same may be provided in both. As a result of the amplification factor being thus controlled, the proportionality constant of the temperature signal with respect to the temperature is controlled. Accordingly, although the MI devices having different voltage values of the detection signals with respect to the magnetic field intensity are connected, proper temperature compensation can be made possible as a result of the proportionality constant being thus controlled. Also, for a case where a change amount of the voltage value of the hold signal with respect to a predetermined temperature change fluctuates, the voltage value of the hold signal can be corrected as a result of the proportionality constant being thus controlled.

Further, the output of the operational amplifier A17, that is, the temperature signal, may be output externally from the magnetic sensor circuit 40B. Therewith, operation check of the temperature detection circuit 43B may be carried out, or, temperature information may be provided to an electronic apparatus in which the magnetic sensor is mounted.

A temperature compensation circuit 44, shown in FIG. 9, includes the operational amplifier A13 and resistors R15 and R16. The non-inverted input terminal of the operational amplifier A13 has the hold signal supplied thereto, and the operational amplifier A13 acts as a non-inverted amplifier for the hold signal. Further, the temperature signal is provided to the inverted input terminal of the operational amplifier A13, and the operational amplifier A13 acts as an inverted amplifier for the temperature signal. This inverted amplifier has an amplification factor expressed by −R16/R15, and this amplification factor becomes −1 when the resistors R15 and R16 have the same resistance value. In this case, an amplification factor of 2 is applied for the hold signal.

Thus, the operational amplifier A13 functions as a differential amplifier between the hold signal and the temperature signal, and outputs an output signal indicating a difference between the hold signal and the temperature signal. Thus, the operational amplifier A13 corrects a voltage fluctuation of the hold signal occurring due to temperature characteristics of the magnetic sensor circuit. As a result, the temperature compensated output signal is output from the magnetic sensor circuit.

The operational amplifier A17 acts as a proportionality constant control circuit controlling an absolute value of the proportionality constant α determined by the ratio between the resistors R18 and R19 and the ratio between the resistors R20 and R21. The proportionality constant control circuit controls the amplification factor of the operational amplifier A17, and compensates a fluctuation amount of the voltage value of the hold signal upon zero magnetic field occurring due to a temperature change. The resistors R18 through R21 are set as follows:

It is assumed that the amplification factor of the operational amplifier A13 for the voltage value of the temperature signal is set in −1. Next, in a condition in which the magnetic field applied to the MI devices is zero, the amplification factor of the operational amplifier A17 is set in such a manner that a voltage change amount of the hold signal and an absolute value of an output voltage change amount of the temperature compensation circuit 43B with respect to a predetermined temperature may be the same as one another. The amplification factor of the operational amplifier A17 is set with the use of the resistors R18 through R21. By carrying out the setting in this manner, a fluctuation amount of the voltage value of the hold signal upon zero magnetic field can be corrected. As a result, voltage fluctuation in the output signal due to a temperature change can be inhibited in a condition where an ordin1ry magnetic field intensity is detected, in the magnetic sensor circuit 40B.

Further, it is preferable to set the amplification factor of the operational amplifier A12 higher than the amplification factor of the operational amplifier A13. For example, the amplification factor of the operational amplifier A12 is set in 8 times while the amplification factor of the operational amplifier A13 is set in 2 times. By making such a setting, a minute hold signal can be amplified by the operational amplifier A12 in a relatively large voltage, and thereby, degradation in an S/N ratio otherwise degrading due to noise contamination or such can be inhibited. Further, by thus setting the amplification factor of the operational amplifier A13 lower, the temperature compensation amount can be finely set, and thus, fine adjustment can be easily carried out, and compensation with a high accuracy can be achieved.

Temperature compensation operation in the magnetic sensor circuit 40B is carried out as follows: A case is assumed that, in the temperature signal polarity switching circuit 47, the switch circuits SW1 and SW2 are closed, while the switch circuits SW3 and SW4 are opened.

Then it is assumed that, the voltage value of the hold signal upon zero magnetic field increases as a result of the temperature of the magnetic sensor circuit 40B increases. In this case, if the temperature compensation operation were not carried out, the output voltage value of the operational amplifier A13 would increase.

However, actually, when the temperature thus increase, the emitter voltage of the PNP transistor Q1 of the temperature detection circuit 43B decreases to be lower than the emitter voltage of the PNP transistor Q2, and a difference therebetween increases. The emitter voltage of the PNP transistor Q1 is supplied to the non-inverted input terminal of the operational amplifier A17, via the operational amplifier A16 and the switch circuit SW2. Also, the emitter voltage of the PNP transistor Q2 is supplied to the inverted input terminal of the operational amplifier A17, via the operational amplifier A15 and the switch circuit SW1. As a result, the output voltage value of the operational amplifier A17 increases, and the output of the operational amplifier A13 falls. Thus, thanks to the temperature compensation operation, a drop of the voltage value of the hold signal due to the temperature rise can be corrected. It is noted that, when the temperature falls, compensation operation reverse to that, described above for the temperature rise, is carried out.

For a case where the voltage of the hold signal upon zero magnetic field falls from a temperature rise in the magnetic sensor circuit 40B, the temperature signal polarity switching circuit 47 is set in such a state that the switch circuits SW1 and SW2 are opened, while the switch circuits SW3 and SW4 are closed.

According to the present embodiment, the amplification circuit 42, the temperature detection circuit 43B and the temperature compensation circuit 44, compensating a voltage fluctuation in the hold signal caused by temperature change, are provided at the output of the sample-and-hold circuit 41. The temperature detection circuit 43B detects the temperature, and outputs the temperature signal corresponding to the temperature. Then, the voltage fluctuation in the hold signal is compensated by the temperature signal. The temperature defection circuit 43B has the temperature signal polarity switching circuit 47 switching a change direction of the temperature signal to output, provided therein. By providing the temperature signal polarity switching circuit 47, an increase/decrease direction of the temperature signal can be set according to a change direction of the hold signal with respect to a temperature change direction. As a result, positive temperature compensation can be achieved suitable to characteristics of the magnetic sensor circuit. Further, since the hold signal is approximately a directed-current signal, temperature compensation can be easily carried out with the use of the temperature signal. Further, especially superior high frequency characteristics are not needed as the operational amplifier applied in the temperature compensation circuit 44, and thereby, temperature compensation with a high accuracy is made possible.

A fourth carrying-out mode of the present invention will now be described.

FIG. 7(A), which shows the cellular phone as one example of an electronic apparatus according to the second carrying-out mode of the present invention described above, also shows a cellular phone as one example of an electronic apparatus according to the fourth carrying-out mode of the present invention, and FIG. 7(B) shows a magnified view of a magnetic sensor.

With reference to FIGS. 7(A) and (B), the cellular phone 50 includes a display part 51, an operation part 52, an antenna 53, a speaker 54, a microphone 56, an electronic substrate 56 and a magnetic sensor 58 mounted on the electronic substrate 56.

The MI sensor 58 includes a semiconductor device 59 in which, in the fourth carrying-out mode, a magnetic sensor circuit (not shown) according to the third carrying-out mode described above is produced, and two MI devices connected to the semiconductor device 59. The two MI devices MIx and MIy are disposed in such manner that they lie perpendicular to one another along the electronic substrate surface. Each of the MI devices MIx and MIy is connected to the magnetic sensor circuit of the semiconductor device 59 via wiring such as electric wires.

The MI sensor 58 detects an orientation or an angle of the cellular phone 50, for example, an orientation/angle in which a longitudinal direction of the operation part 52 lies, based on the direction of the earth magnetism. On the display part 51 of the cellular phone 50, a map of a current position and therearound is displayed in such a manner that the orientation/angle coincident with the longitudinal direction of the operation part 52 coincides with the top of the display part 51.

As described above, the MI sensor 58 has the magnetic sensor circuit according to the third carrying-out mode mounted on the semiconductor device, in the cellular phone 50. The magnetic sensor circuit can detect the magnetic field intensity with a high accuracy even when temperature change occurs. Accordingly, detection of the orientation/angle has high reliability. Further, since the semiconductor device 59 is made of a single semiconductor chip, miniaturization of the magnetic sensor circuit is made possible. As a result, the cellular phone 50 can be miniaturized as a result of the semiconductor device 59 being applied.

A basic configuration itself for a communication function of the cellular phone 50 is well-known, and thus details thereof are omitted here. Although an electronic apparatus according to the present carrying-out mode has been thus described as the cellular phone as one example, a carrying-out mode of the electronic apparatus is not necessarily be limited to the cellular phone. For example, a portable terminal apparatus, a car navigation system or such may be applied instead.

Further, the present invention is not limited to the above-described embodiments, and variations and modifications may be made without departing from the basic concept of the present invention claimed below.

The present application is based on Japanese Priority Applications Nos. 2004-377763 and 2004-377764, filed on Dec. 27, 2004 and Dec. 27, 2004, respectively, the entire contents of which are hereby incorporated herein by reference.

What is claimed is:

1. A magnetic sensor circuit supplying an excitation current to an MI device, and having a detection signal supplied thereto corresponding to a magnetic field intensity from the MI device based on the excitation current, said magnetic sensor circuit comprising:
   a pulse current supplying circuit supplying a pulse current to the MI device;
   a sample-and-hold circuit holding an approximately peak value of the detection signal and outputting a hold signal; and
   a temperature compensation part correcting the hold signal to compensate temperature characteristics of the magnetic sensor circuit, wherein:
   said sample-and-hold circuit comprises a switching circuit and a holding capacitor; and
   said switching circuit has an opening/closing control signal supplied thereto based on timing of the pulse current.

2. The magnetic sensor circuit as claimed in claim 1, wherein:
   said temperature compensation part comprises:
   a temperature detection circuit detecting a temperature of the magnetic sensor circuit and outputting a temperature signal corresponding to the temperature; and
   a temperature compensation circuit correcting a voltage value of the hold signal based on the temperature signal.

3. The magnetic sensor circuit as claimed in claim 2, wherein:
   said temperature detection circuit detects the temperature with the use of temperature characteristics of a diode's voltage-to-current characteristics in said temperature detection circuit.

4. The magnetic sensor circuit as claimed in claim 1, wherein:
   said MI device comprises an amorphous wire and a detection coil; and
   said sample-and-hold circuit has the detection signal supplied thereto, said detection signal being one excited in the detection coil when the pulse signal flows through the amorphous wire.

5. A semiconductor device supplying an excitation current to an MI device, and having a detection signal supplied thereto corresponding to a magnetic field intensity from the MI device based on the excitation current, said semiconductor device comprising:
   the magnetic sensor circuit claimed in claim 1.

6. A magnetic sensor circuit supplying an excitation current to an MI device, and having a detection signal supplied thereto corresponding to a magnetic field intensity from the MI device based on the excitation current, said magnetic sensor circuit comprising:
   a pulse current supplying circuit supplying a pulse current to the MI device;

a sample-and-hold circuit holding an approximately peak value of the detection signal and outputting a hold signal; and a temperature compensation part correcting the hold signal to compensate temperature characteristics of the magnetic sensor circuit, wherein:

said temperature compensation part comprises:

a temperature detection circuit detecting a temperature of the magnetic sensor circuit and outputting a temperature signal corresponding to the temperature; and a temperature compensation circuit correcting a voltage value of the hold signal based on the temperature signal, wherein:

an amplification circuit is provided between the sample-and-hold circuit and the temperature compensation circuit; and said amplification circuit has an amplification factor higher than that of the temperature compensation circuit.

7. The magnetic sensor circuit as claimed in claim 6, wherein:

said temperature compensation circuit corrects the hold signal with the use of the temperature signal as a reference voltage value.

8. The magnetic sensor circuit as claimed in claim 6, wherein:

said temperature signal has a voltage value corresponding to the temperature.

9. The magnetic sensor circuit as claimed in claim 6, wherein:

said temperature detection circuit comprises:

a first PN junction device and a second PN junction device having a current supplied thereto, said current being smaller in a current density than that of the first PN junction device, both having a same electric potential set to their cathodes; and an amplifier circuit connected to respective anode sides of said first and second PN junction devices, and outputting the temperature signal having a voltage value corresponding to an electric potential difference between the anode sides.

10. The magnetic sensor circuit as claimed in claim 9, wherein:

said first and second PN junction devices comprise first and second transistors having mutually different device areas; and respective collectors and bases of the first and second transistors are connected together, approximately equal currents are supplied to their emitters, and the respective emitters are connected to an input part of the amplifier circuit.

11. The magnetic sensor circuit as claimed in claim 6, wherein:

said temperature compensation part comprises a temperature detection circuit detecting a temperature of the magnetic sensor circuit and outputting a temperature signal corresponding to the temperature; and said temperature detection circuit comprises a proportionality constant control circuit controlling a proportionality constant of a voltage value of the temperature signal corresponding to the temperature.

12. The magnetic sensor circuit as claimed in claim 11, wherein:

the proportionality constant control is carried out in a state in which the magnetic field intensity applied to the MI device is approximately zero.

13. The magnetic sensor circuit as claimed in claim 6, wherein:

said temperature detection circuit detects the temperature with the use of temperature characteristics of a diode's voltage-to-current characteristics in said temperature detection circuit.

14. A semiconductor device supplying an excitation current to an MI device, and having a detection signal supplied thereto corresponding to a magnetic field intensity from the MI device based on the excitation current, said semiconductor device comprising:

the magnetic sensor circuit claimed in claim 6.

15. A magnetic sensor circuit supplying an excitation current to an MI device, and having a detection signal supplied thereto corresponding to a magnetic field intensity from the MI device based on the excitation current, said magnetic sensor circuit comprising:

a pulse current supplying circuit supplying a pulse current to the MI device;

a sample-and-hold circuit maintaining an approximately peak value of the detection signal and outputting a hold signal; and a temperature compensation part detecting a temperature of the magnetic sensor circuit, and correcting the hold signal to compensate temperature characteristics of the magnetic sensor circuit, based on a temperature signal corresponding to the temperature, wherein:

said temperature compensation circuit comprises a temperature signal polarity switching part switching a relation between a change direction of the temperature and a change direction of the temperature signal.

16. The magnetic sensor circuit as claimed in claim 15, wherein:

said temperature compensation part comprises:

a temperature detection circuit detecting a temperature of the magnetic sensor circuit and outputting a temperature signal corresponding to the temperature; and a temperature compensation circuit correcting a voltage value of the hold signal based on the temperature signal, wherein:

said temperature signal polarity switching circuit is provided in the temperature detection circuit.

17. The magnetic sensor circuit as claimed in claim 15, wherein:

said MI device comprises an amorphous wire and a detection coil; and said sample-and-hold circuit has the detection signal supplied thereto, said detection signal being one induced in the detection coil when the pulse signal flows through the amorphous wire.

18. The magnetic sensor circuit as claimed in claim 15, wherein:

said sample-and-hold circuit comprises a switching circuit and a holding capacitor; and said switching circuit has an opening/closing control signal supplied thereto based on timing of the pulse current.

19. The magnetic sensor circuit as claimed in claim 15, wherein:

said temperature compensation part comprises:

a temperature detection circuit detecting a temperature of the magnetic sensor circuit and outputting a temperature signal corresponding to the temperature; and a temperature compensation circuit correcting a voltage value of the hold signal based on the temperature signal, wherein:

an amplification circuit is provided between the sample-and-hold circuit and the temperature compensation circuit; and said amplification circuit has an amplification factor higher than that of the temperature compensation circuit.

20. The magnetic sensor circuit as claimed in claim 15, wherein:
said temperature compensation part comprises:
a temperature detection circuit detecting a temperature of the magnetic sensor circuit and outputting a temperature signal corresponding to the temperature; and
a temperature compensation circuit correcting a voltage value of the hold signal based on the temperature signal, wherein:
said temperature compensation circuit corrects the hold signal with the use of the temperature signal as a reference voltage value.

21. The magnetic sensor circuit as claimed in claim 15, wherein:
said temperature signal has a voltage value corresponding to the temperature.

22. The magnetic sensor circuit as claimed in claim 15, wherein:
said temperature compensation part comprises a temperature detection circuit detecting a temperature of the magnetic sensor circuit and outputting a temperature signal corresponding to the temperature; and
said temperature detection circuit comprises:
a first PN junction device and a second PN junction device having a current supplied thereto, said current being smaller in a current density than that of the first PN junction device, both having a same electric potential set to their cathodes; and
an amplifier circuit connected to respective anode sides of said first and second PN junction devices, and outputting the temperature signal having a voltage value corresponding to an electric potential difference between the anode sides, wherein:
said temperature signal polarity switching part comprises a polarity switching circuit connecting between the respective anode sides of the first and second PN junction devices and respective one of two inputs of the amplifier circuit.

23. The magnetic sensor circuit as claimed in claim 22, wherein:
said polarity switching circuit has a switching signal supplied thereto, said switching signal controlling the relation between the change direction of the temperature and the change direction of the temperature signal.

24. The magnetic sensor circuit as claimed in claim 22, wherein:
said first and second PN junction devices comprise first and second transistors having mutually different device areas; and
respective collectors and bases of the first and second transistors are connected together, approximately equal currents are supplied to their emitters, and the respective emitters are connected to an input part of the polarity switching circuit.

25. The magnetic sensor circuit as claimed in claim 22, wherein:
said polarity switching circuit comprises:
a first switch coupled between the anode of the first PN junction device and a first input of the amplifier circuit;
a second switch coupled between the anode of the second PN junction device and a second input of the amplifier circuit;
a third switch coupled between the anode of the first PN junction device and the second input of the amplifier circuit;
a fourth switch coupled between the anode of the second PN junction device and the first input of the amplifier circuit; and
an inverter having a first node and a second node, wherein:
the first node is coupled to respective control nodes of said first and second switches, and
the second node is coupled to respective control nodes of said third and fourth switches.

26. The magnetic sensor circuit as claimed in claim 15, wherein:
said temperature compensation part comprises a temperature detection circuit detecting a temperature of the magnetic sensor circuit and outputting a temperature signal corresponding to the temperature; and
said temperature detection circuit comprises a proportionality constant control circuit controlling a proportionality constant of a voltage value of the temperature signal with respect to the temperature.

27. The magnetic sensor circuit as claimed in claim 26, wherein:
the proportionality constant control is carried out in a state in which the magnetic field intensity applied to the MI device is approximately zero.

28. A semiconductor device supplying an excitation current to an MI device, and having a detection signal supplied thereto corresponding to a magnetic field intensity from the MI device based on the excitation current, said semiconductor device comprising:
the magnetic sensor circuit claimed in claim 15.

* * * * *